US008731116B2

(12) United States Patent
Norconk et al.

(10) Patent No.: US 8,731,116 B2
(45) Date of Patent: May 20, 2014

(54) SYSTEM AND METHOD OF PROVIDING COMMUNICATIONS IN A WIRELESS POWER TRANSFER SYSTEM

(75) Inventors: Matthew J. Norconk, Grand Rapids, MI (US); Joshua K. Schwannecke, Grand Rapids, MI (US); Colin J. Moore, Grand Rapids, MI (US); Joshua B. Taylor, Rockford, MI (US); Neil W. Kuyvenhoven, Ada, MI (US); Dale R. Liff, Kent, OH (US); Jason L. Amistadi, Lyndhurst, OH (US); Robert D. Gruich, Copley, OH (US); Arthur Kelley, Raleigh, NC (US); Kenneth C. Armstrong, Cary, NC (US)

(73) Assignee: Access Business Group International LLC, Ada, MI (US)

(*) Notice: Subject to any disclaimer, the term of this patent is extended or adjusted under 35 U.S.C. 154(b) by 42 days.

(21) Appl. No.: 13/366,605

(22) Filed: Feb. 6, 2012

(65) Prior Publication Data

US 2013/0039395 A1 Feb. 14, 2013

Related U.S. Application Data

(60) Provisional application No. 61/440,138, filed on Feb. 7, 2011, provisional application No. 61/564,130, filed on Nov. 28, 2011.

(51) Int. Cl.
*H04L 27/06* (2006.01)
*H03K 9/00* (2006.01)

(52) U.S. Cl.
USPC .......... 375/342; 375/340; 375/316; 455/41.4; 455/39; 340/10.1; 340/10.2

(58) Field of Classification Search
USPC ......... 375/308, 326, 324, 322, 316, 342, 340; 178/43; 320/108; 307/104, 116; 340/447, 505, 10.1, 10.2; 455/127.1, 455/41.1, 39
See application file for complete search history.

(56) References Cited

U.S. PATENT DOCUMENTS 5,105,190 A  4/1992  Kip et al.
(Continued)

FOREIGN PATENT DOCUMENTS

AT  506311    8/2009
EP  0 533 247  3/1993
(Continued)

OTHER PUBLICATIONS

U.S. Appl. No. 61/298,021 entitled Systems and Methods for Detecting Data Communication Over a Wireless Power Link, filed Jan. 25, 2010 by Matthew J. Norconk.

(Continued)

*Primary Examiner* — Chieh M Fan
*Assistant Examiner* — Michelle M Koeth
(74) *Attorney, Agent, or Firm* — Warner Norcross & Judd LLP

(57) ABSTRACT

A communication system that uses keyed modulation to encode fixed frequency communications on a variable frequency power transmission signal in which a single communication bit is represented by a plurality of modulations. To provide a fixed communication rate, the number of modulations associated with each bit is dynamic varying as a function of the ratio of the communication frequency to the carrier signal frequency. In one embodiment, the present invention provides dynamic phase-shift-keyed modulation in which communications are generated by toggling a load at a rate that is a fraction of the power transfer frequency. In another embodiment, the present invention provides communication by toggling a load in the communication transmitter at a rate that is phase locked and at a harmonic of the power transfer frequency. In yet another embodiment, the present invention provides frequency-shift-keyed modulation, including, for example, modulation at one of two different frequencies.

46 Claims, 18 Drawing Sheets

(56) References Cited

U.S. PATENT DOCUMENTS

| | | | |
|---|---|---|---|
| 5,367,242 A | 11/1994 | Hulman | |
| 5,455,466 A | 10/1995 | Parks et al. | |
| 5,596,567 A | 1/1997 | deMuro et al. | |
| 5,734,254 A | 3/1998 | Stephens | |
| 5,896,278 A | 4/1999 | Tamura et al. | |
| 5,898,738 A * | 4/1999 | Nagata et al. | 375/326 |
| 5,963,012 A | 10/1999 | Garcia et al. | |
| 6,057,668 A | 5/2000 | Chao | |
| 6,118,249 A | 9/2000 | Brockmann et al. | |
| 6,184,651 B1 | 2/2001 | Fernandez et al. | |
| 6,329,808 B1 | 12/2001 | Enguent | |
| 6,427,065 B1 | 7/2002 | Suga et al. | |
| 6,469,472 B1 | 10/2002 | Aoshima et al. | |
| 6,844,702 B2 | 1/2005 | Giannopoulos et al. | |
| 6,912,137 B2 | 6/2005 | Berghegger | |
| 7,076,206 B2 | 7/2006 | Elferich et al. | |
| 7,366,466 B2 | 4/2008 | Forster et al. | |
| 7,623,831 B2 | 11/2009 | Forster et al. | |
| 7,697,892 B2 | 4/2010 | Komoriya | |
| 7,953,369 B2 | 5/2011 | Baarman | |
| 8,004,235 B2 | 8/2011 | Baarman et al. | |
| 8,060,011 B2 | 11/2011 | Jin | |
| 8,090,550 B2 | 1/2012 | Azancot et al. | |
| 2002/0022454 A1 * | 2/2002 | Serra et al. | 455/41 |
| 2002/0154518 A1 | 10/2002 | Elferich et al. | |
| 2003/0214821 A1 | 11/2003 | Giannopoulos et al. | |
| 2005/0068019 A1 | 3/2005 | Nakamura et al. | |
| 2007/0042729 A1 | 2/2007 | Baaman et al. | |
| 2007/0228833 A1 | 10/2007 | Stevens et al. | |
| 2008/0194200 A1 | 8/2008 | Keen et al. | |
| 2009/0011706 A1 | 1/2009 | Wilson et al. | |
| 2009/0101716 A1 | 4/2009 | Mani et al. | |
| 2009/0133942 A1 | 5/2009 | Iisaka et al. | |
| 2009/0243394 A1 | 10/2009 | Levine | |
| 2009/0309652 A1 * | 12/2009 | Kranabenter | 329/347 |
| 2010/0072825 A1 | 3/2010 | Azancot et al. | |
| 2010/0151808 A1 | 6/2010 | Toncich et al. | |
| 2010/0171369 A1 | 7/2010 | Baarman et al. | |
| 2010/0240303 A1 | 9/2010 | Charrat | |
| 2011/0050164 A1 | 3/2011 | Partovi et al. | |
| 2011/0065398 A1 | 3/2011 | Liu et al. | |
| 2011/0158329 A1 * | 6/2011 | Oettinger et al. | 375/258 |
| 2011/0163608 A1 | 7/2011 | Brohlin et al. | |
| 2011/0199045 A1 | 8/2011 | Hui et al. | |
| 2011/0204711 A1 | 8/2011 | Norconk et al. | |
| 2012/0066524 A1 | 3/2012 | Kim et al. | |
| 2012/0155344 A1 | 6/2012 | Wiley et al. | |

FOREIGN PATENT DOCUMENTS

| | | |
|---|---|---|
| JP | 09-103037 | 4/1997 |
| WO | 89/10030 | 10/1989 |
| WO | WO 2007/024416 | 3/2007 |

OTHER PUBLICATIONS

System Description Wireless Power Transfer; vol. 1: Low Power; Part 1: Interface Definition; Version 1.0; Wireless Power Consortium; Jul. 2010.

System Description Wireless Power Transfer; vol. 1: Low Power; Part 1: Interface Definition; Version 1.0.3; Wireless Power Consortium; Sep. 2011.

Invitation to Pay Additional Fees for PCT/US2012/023959, dated May 7, 2012.

PCT International Search Report for Application No. PCT/US2012/023959 mailed on Aug. 20, 2012.

PCT Written Opinion of the International Searching Authority for Application No. PCT/US2012/023959 mailed on Aug. 20, 2012.

* cited by examiner

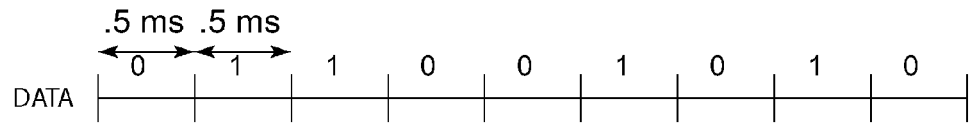
Fig.10A
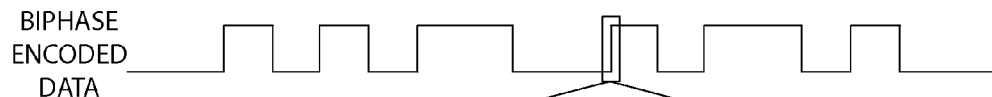
Fig.10B
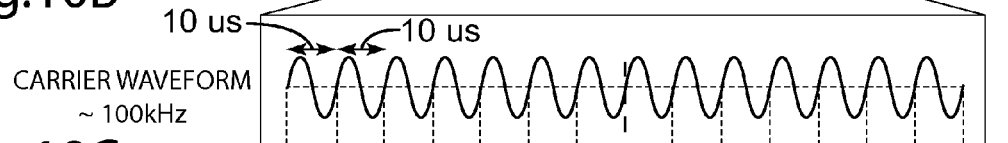
Fig.10C
Fig.10D
Fig.10E
Fig.10F
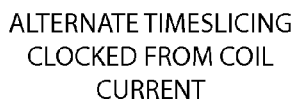
Fig.10G
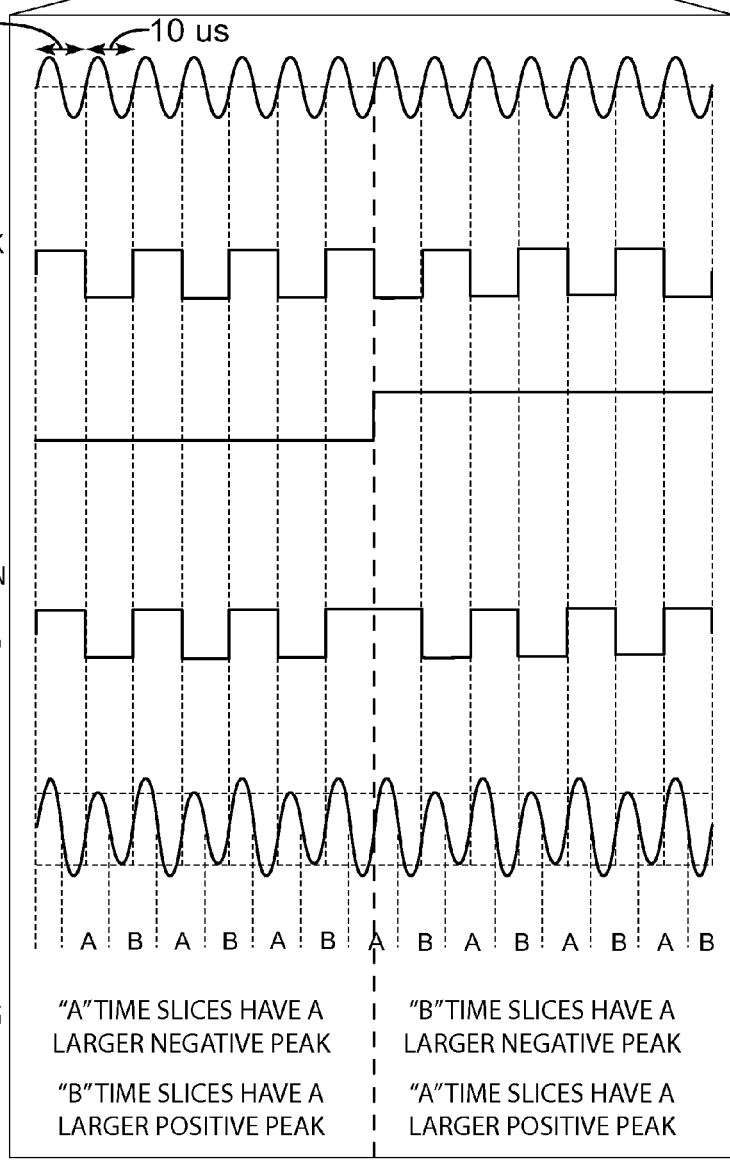
Fig.10H

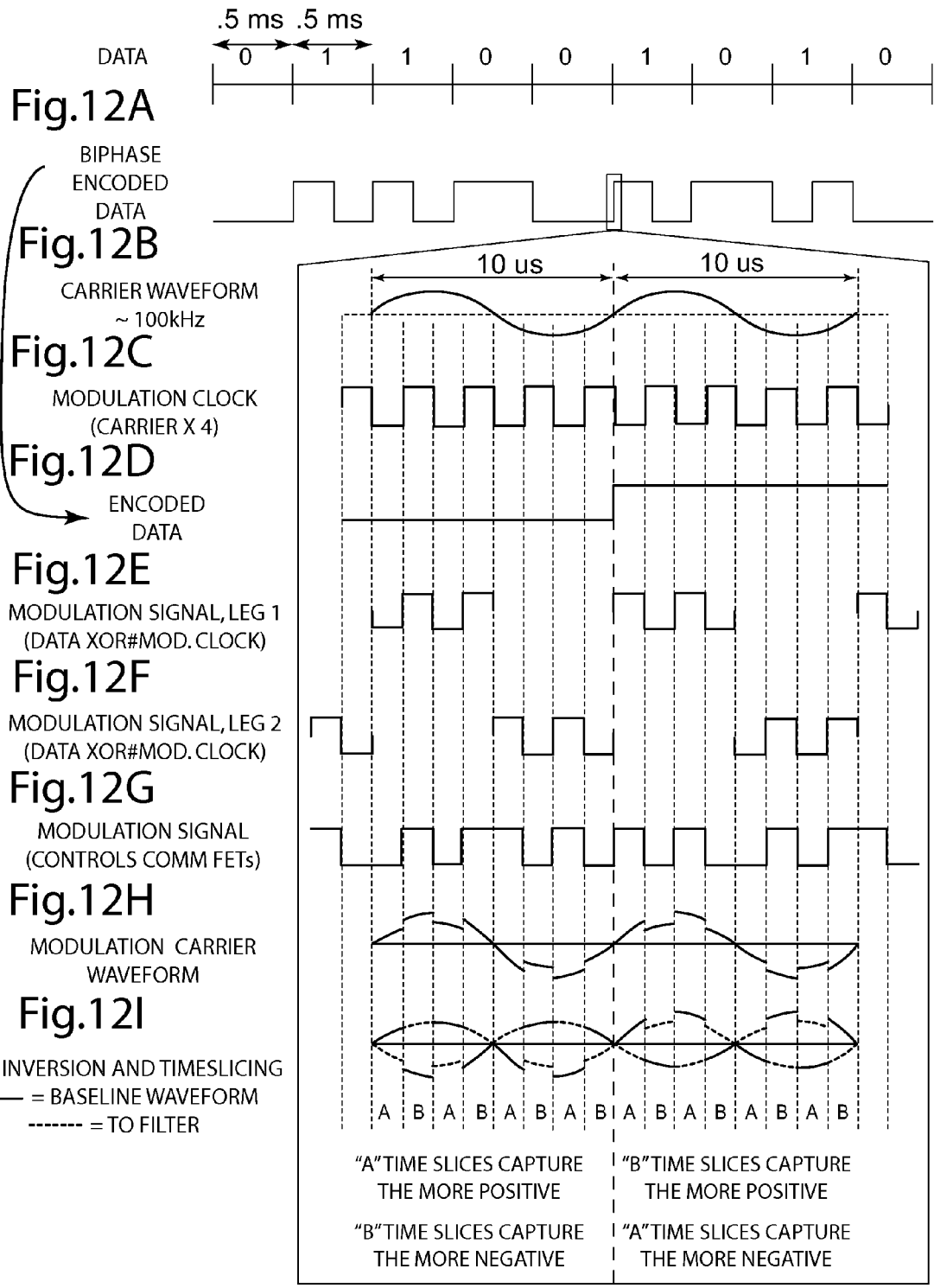

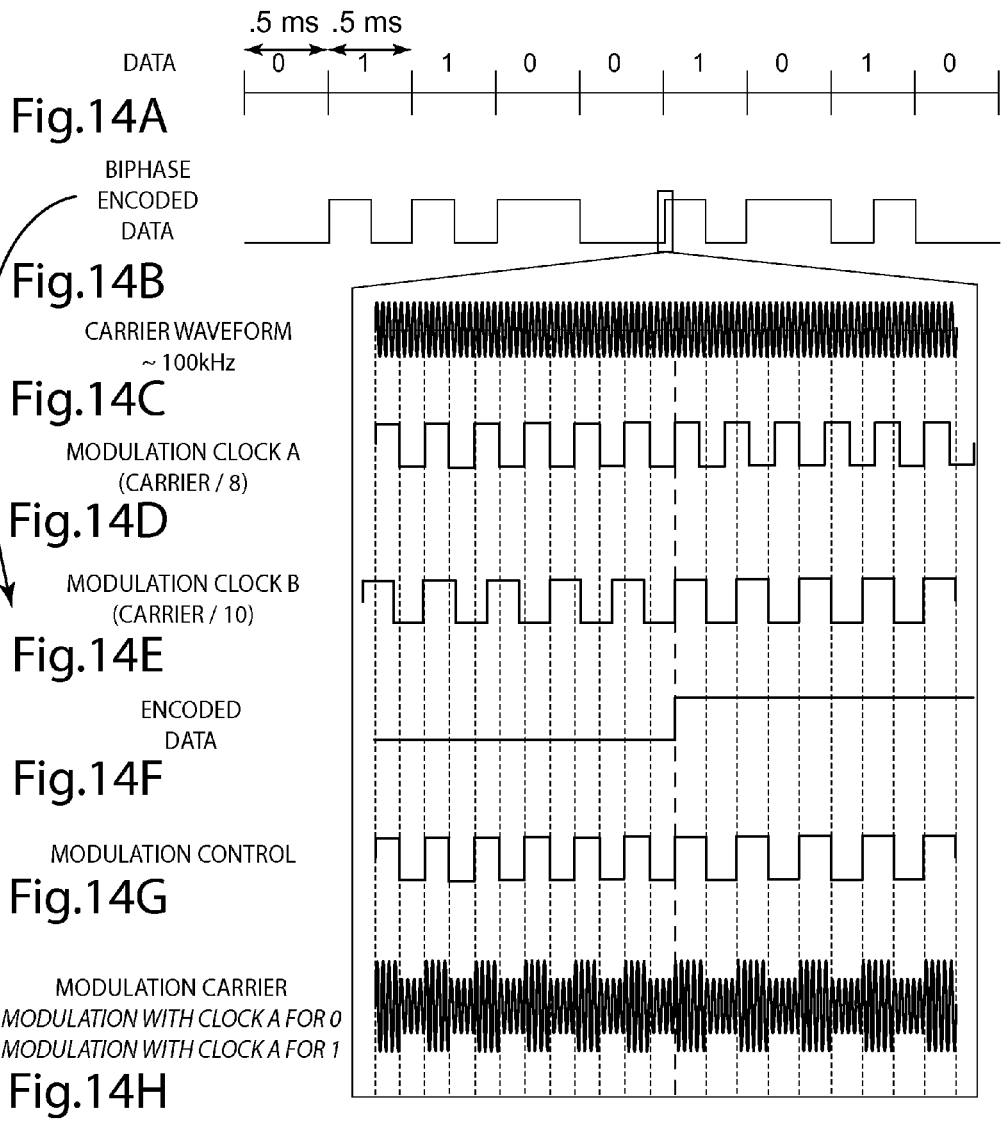

SYSTEM AND METHOD OF PROVIDING COMMUNICATIONS IN A WIRELESS POWER TRANSFER SYSTEM

BACKGROUND OF THE INVENTION

The present invention relates to wireless power transfer systems, and more particularly to systems and methods for providing communications in a wireless power transfer system.

Many conventional wireless power supply systems rely on inductive power transfer to convey electrical power without wires. A typical inductive power transfer system includes an inductive power supply that uses a primary coil to wirelessly transfer energy in the form of a varying electromagnetic field and a remote device that uses a secondary coil to convert the energy in the electromagnetic field into electrical power. Recognizing the potential benefits, some developers have focused on producing wireless power supply systems with adaptive control systems capable of adapting to maximize efficiency and provide appropriate operation to a variety of different types of devices under a wide range of circumstances. Adaptive control systems may vary operating parameters such as resonant frequency, operating frequency, rail voltage or duty cycle, to supply the appropriate amount of power and to adjust to various operating conditions. For example, it may be desirable to vary the operating parameters of the wireless power supply based on the number of electronic device(s), the general power requirements of the electronic device(s) and the instantaneous power needs of the electronic device(s). As another example, the distance, location and orientation of the electronic device(s) with respect to the primary coil may affect the efficiency of the power transfer, and variations in operating parameters may be used to optimize operation. In a further example, the presence of parasitic metal in range of the wireless power supply may affect performance or present other undesirable issues. The adaptive control system may respond to the presence of parasitic metal by adjusting operating parameters or shutting down the power supply. In addition to these examples, those skilled in the field will recognize additional benefits from the use of an adaptive control system.

To provide improved efficiency and other benefits, it is not uncommon for conventional wireless power supply systems to incorporate a communication system that allows the remote device to communicate with the power supply. In some cases, the communication system allows one-way communication from the remote device to the power supply. In other cases, the system provides bi-directional communications that allow communication to flow in both directions. For example, the wireless power supply and the remote device may perform a handshake or otherwise communicate to establish that the remote device is compatible with the wireless power supply. The remote device may also communicate its general power requirements, as well as information representative of the amount of power it is receiving from the wireless power supply. This information may allow the wireless power supply to adjust its operating parameters to supply the appropriate amount of power at optimum efficiency. These and other benefits may result from the existence of a communication channel from the remote device to the wireless power supply.

An efficient and effective method for providing communication in a wireless power supply that transfers power using an inductive field is to overlay the communications on the inductive field. This allows communication without the need to add a separate wireless communication link. One common method for embedding communications in the inductive field is referred to as "backscatter modulation." Backscatter modulation relies on the principle that the impedance of the remote device is conveyed back to the power supply through reflected impedance. With backscatter modulation, the impedance of the remote device is selectively varied to create a data stream (e.g. a bit stream) that is conveyed to power supply by reflected impedance. For example, the impedance may be modulated by selectively applying a load resistor to the secondary circuit. The power supply monitors a characteristic of the power in the tank circuit that is impacted by the reflected impedance. For example, the power supply may monitor the current in the tank circuit for fluctuations that represent a data stream.

A variety of schemes have been developed for encoding data that is transmitted on an inductive field using backscatter modulation. One common approach is bi-phase modulation. Bi-phase modulation uses a scheme in which the signal varies from high to low at every clock pulse. To encode a "1," the modulator adds an additional transition during the time period associated with that bit. To encode a "0," the clock pulse transition is the only transition to occur during the time period associated with that bit.

Wireless power communications can be disrupted if the device being powered presents a noisy load. For example, changes in the amount of power consumed in a device may change the impedance of the remote device. These changes in impedance may create the appearance of data when none exists or they may corrupt legitimate data. The power supply can be especially susceptible to noise that occurs at that same frequency as the data communications. For example, it is possible that load fluctuations occurring while data is being transmitted will mask the legitimate data. As another example, if occurring in the same frequency range as the data communications, it is possible that a random pattern in the noise will be misinterpreted as the preamble or start bits in a legitimate communication signal. If this occurs, the power supply may think it is receiving legitimate data and attempt to extract data, for example, in the form of a data packet, following the faux preamble. Although the power supply should eventually determine that the data packet is not legitimate, the power supply may be occupied with the illegitimate packet, which would delay its ability to recognize legitimate data.

Further, in some applications, the remote device is configured to send "keep-alive" signals to the wireless power supply. The keep-alive signal may, for example, tell the wireless power supply that a compatible remote device that needs power is present. If noise prevents a consecutive number of keep-alive signals from being recognized by the wireless power supply, the supply of power to the device may be discontinued. This can be particularly problematic when the remote device battery is depleted.

SUMMARY OF THE INVENTION

The present invention provides a communication system that uses keyed modulation to encode fixed frequency communications on a variable frequency power transmission signal. In one embodiment, a single communication bit (e.g. a single logic high or logic low) is represented by a plurality of modulations. To provide a fixed communication rate, the number of modulations associated with each bit is dynamically varying as a function of the ratio of the communication frequency to the carrier signal frequency.

In one embodiment, the present invention provides dynamic phase-shift-keyed modulation. In this embodiment, the present invention provides communication by toggling a load in the communication transmitter at a rate that is a fraction of the power transfer frequency. For example, the load may be modulated at a frequency that is one-half the power transfer frequency. The communication transmitter may be configured to modulate on every other waveform, increasing the magnitude of every other waveform. Data is encoded by varying whether the modulation takes place on every even waveform or every odd waveform. In one embodiment, the communication transmitter includes a modulation clock operating at a frequency that is ½ the frequency of the carrier. In this embodiment, the output of the modulation clock may be "XOR"ed with the data signal to produce the modulation control signal. The data signal may have a fixed frequency. In this embodiment, the communication receiver may decode the communication signal by timeslicing the coil current (which will correspond with the modulated carrier waveform) and looking for a DC offset between the two time slices.

In another embodiment, the present invention provides communication by toggling a load in the communication transmitter at a rate that is phase locked and at a harmonic frequency of the power transfer frequency. For example, the load may be toggled at a frequency that is four times the carrier frequency. As the load modulation frequency varies with variations in the carrier frequency, the number of modulations that occur during the fixed communication frequency will vary. Data is encoded by varying the modulation applied to the positive and negative halves of each cycle. During the positive half of the waveform, the modulation signal is generated by "XOR"ing the modulation clock signal with the data signal. During the negative half of the waveform, the modulation signal is generated by "XOR#"ing (also known as "XNOR"ing) the modulation clock signal and the data signal (i.e. inverse of "XOR"ing the modulation clock signal and the data signal). In this embodiment, the communication receiver may decode the communication signal by producing a buffer copy and an inverted copy of the coil current signal, and then alternately passing time slices of the buffer copy or the inverted copy to the controller. The time slices are synchronized with the modulation frequency. The controller recognizes a high or low signal by looking for a DC offset. For example, a low signal may result in a negative offset while a high signal may result in a positive offset.

In yet another embodiment, the present invention provides frequency-shift-keyed modulation. In this embodiment, the communication transmitter may be configured to modulate at one of two different frequencies. A high signal is encoded by modulating at a first frequency and a low signal is encoded by modulating at a second frequency. The first frequency may be a fraction, such as $⅛^{th}$, of the carrier frequency and the second frequency may be a different fraction, such as $1/10^{th}$, of the carrier frequency. In this embodiment, the communication receiver may decode the communication signal by filtering the coil current and passing it to a frequency discriminator.

The present invention provides simple and effective systems and methods for transmitting communications at a fixed frequency using a variable frequency carrier signal. The systems and methods of the present invention provide improved reliability when transmitting communications over an inductive field by backscatter modulation. By using a plurality of modulations for each bit, variations or other defects in one or more modulations may be averaged out over the plurality of modulations and may not corrupt the data. Further, communication modulation occurs during both high and low signals so communications do not result in dramatic variations in load between high and low signals. In some applications, timeslicing is used so that the base drive waveform cancels itself out, thereby providing a potentially higher signal to noise ratio.

These and other objects, advantages, and features of the invention will be more fully understood and appreciated by reference to the description of the current embodiment and the drawings.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

BRIEF DESCRIPTION OF THE DRAWINGS

FIG. 10 is a series of waveform diagrams representative of a first communication method.

FIG. 12 is a series of waveform diagrams representative of a second communication method.

FIG. 14 is a series of waveform diagrams representative of a third communication method.

DESCRIPTION OF THE CURRENT EMBODIMENT

I. Overview

Figure 1:
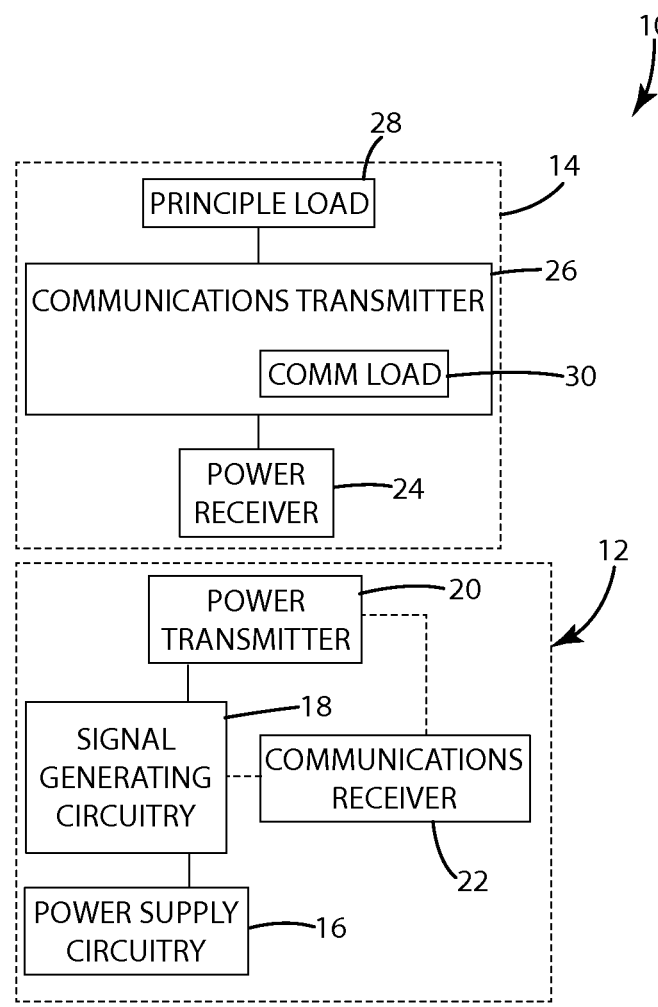
FIG. 1 is a schematic representation of a wireless power transfer system in accordance with an embodiment of the present invention.

A wireless power transfer system in accordance with an embodiment of the present invention is shown in FIG. 1. The wireless power transfer system 10 generally includes a wireless power supply 12 and a remote device 14. The wireless power supply 12 is capable of wirelessly supplying power to the remote device 14 by an inductive field that can be coupled to the remote device 14. The remote device 14 is configured to send communications to the wireless power supply 12 by overlaying the communications onto the inductive field produced by the wireless power supply 12. The wireless power supply 12 generally includes power supply circuitry 16, signal generating circuitry 18, a power transmitter 20 and a wireless communication receiver 22. The wireless communication receiver 22 is configured to receive communication from the remote device 14 via backscatter modulation. The remote device 14 generally includes a power receiver 24, a communications transmitter 26 and a principle load 28. The communication transmitter 26 may include a communication load 30 that can be selectively applied to vary the impedance of the remote device 14 and thereby create data signals that are reflected back to the wireless power supply 12 through reflected impedance. The communication transmitter 26 is configured to produce signals by modulating a load a plurality of times during each bit time. The characteristics of each modulation may be independent of the frequency of the carrier signal and may remain essentially constant regardless of changes in the frequency of the carrier signal. However, the number of modulations occurring during a bit time may be a function of the frequency of the carrier signal, for example, a fraction or a multiple of the carrier signal frequency. The load may be modulated to provide an improved form of phase keyed shifting or an improved form of frequency keyed shifting. The communication signals may be decoded by sensing a characteristic of power affected by the modulations and averaging the sensed characteristic over time.

II. Wireless Power Transfer Systems

The present invention relates to systems and methods for transmitting communications in the context of a wireless power transfer system. The systems and methods of the present invention relate to the transfer of communications by overlaying data onto the electromagnetic fields used to transmit power. The present invention is well-suited for use in transmitting essentially any type of data. For example, the communication systems and methods of the present invention may be used to transmit control signals relating to operation of the wireless power transfer system, such as signals that identify the remote device, provide wireless power supply control parameters or provide information in real-time relating to wireless power supply (e.g. current, voltage, temperature, battery condition, charging status and remote device status). As another example, the communication systems and methods may be used to transfer data unrelated to the wireless power transfer system, such as transferring information associated with features of the remote device, including synchronizing calendars and to-do lists or transferring files (e.g. audio, video, image, spreadsheet, database, word processing and application files—just to name a few). The present invention is described in the context of various embodiments in which communications are transmitted from the remote device 14 to the wireless power supply 12. Although not described in detail, it should be understood that the present invention may also be used to transfer communications from the wireless power supply 12 to the remote device 14 (or to a plurality of remote devices).

Figure 2:
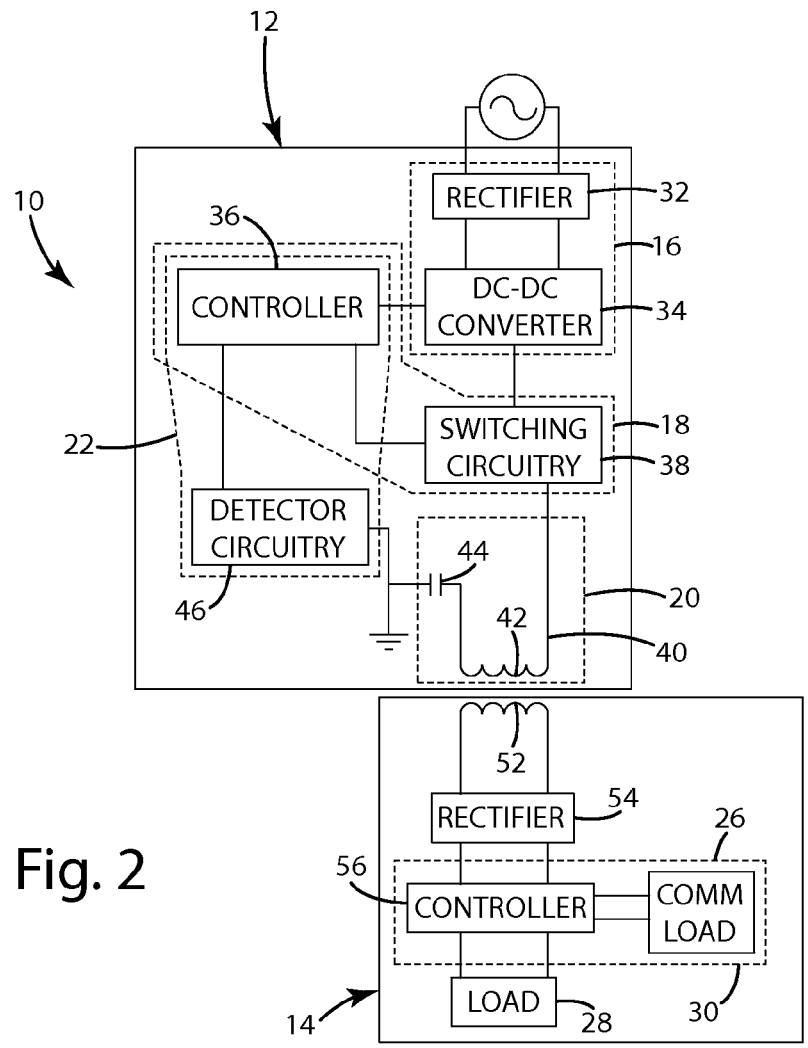
FIG. 2 is a schematic representation of an embodiment of the wireless power transfer system of FIG. 1.

The present invention is described in connection with an adaptive wireless power supply 12 that is capable of adjusting operating parameters, such as operating frequency, resonant frequency, rail voltage and/or duty cycle, based on communications (e.g. data) from the remote device 14. Although the present invention is described in connection with an adaptive wireless power supply, it may be implemented in connection with essentially any type of wireless power supply in which the wireless transfer of communications is desired. As noted above, the wireless power supply 12 of FIG. 1 generally includes power supply circuitry 16, signal generating circuitry 18, a power transmitter 20 and a communications receiver 22. FIG. 2 provides a more detailed schematic of one embodiment of the wireless power supply 12 of FIG. 1. In this embodiment, the power supply circuitry 16 generally includes a rectifier 32 and a DC-DC converter 34. The rectifier 32 and DC-DC converter 34 provide the appropriate DC power for the power supply signal. The power supply circuitry 16 may alternatively be essentially any circuitry capable of transforming input power to the form used by the signal generating circuitry 18. In this embodiment, the signal generating circuitry 18 includes a portion of controller 36 and switching circuitry 38. The controller 36 is configured, among other things, to operate the switching circuitry 38 to apply the desired power supply signal to the power transmitter 20. In this embodiment, the power transmitter 20 includes a tank circuit 40 having a primary coil 42 and a ballast capacitor 44. In this embodiment, the communication receiver 22 includes a detector circuit 46 and portions of controller 36. The detector circuit 46 is coupled to the tank circuit 40 in this embodiment, but may be coupled elsewhere as described in more detail below. As can be seen, the wireless power supply 12 of this embodiment includes a controller 36 that performs various functions, such as controlling the timing of the switching circuit 38 and cooperating with the detector circuit 46 to extract and interpret communications signals. These functions may alternatively be handled by separate controllers or other dedicated circuitry.

Figure 3:
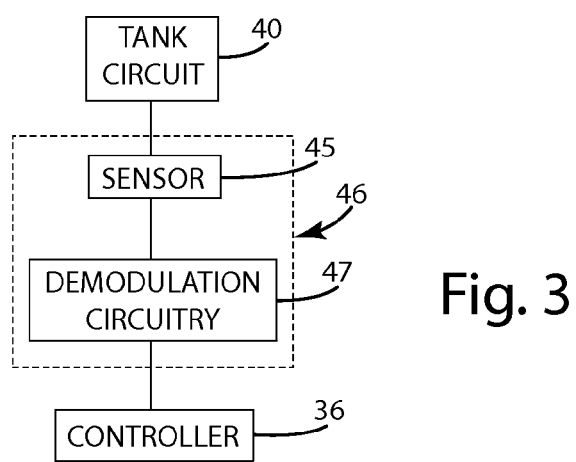
FIG. 3 is a schematic representation of a detector circuit.

The detector circuit described generally above may be implemented in a wide variety of different embodiments. For example, the detector circuit may vary from embodiment to embodiment depending upon the type of modulation/demodulation implemented in that embodiment and/or depending on the details of the power supply circuitry. Further, each modulation/demodulation scheme may be implemented using a variety of different circuits. Generally speaking, the detector circuit is configured to produce an output signal as a function of a characteristic of power in the power supply that is affected by data communicated through reflected impedance. For example, with reference to FIG. 3, the detector circuit 46 may include a sensor 45 to sense the current in the tank circuit 40 and demodulation circuitry 47 to convert the sensed current into a stream of high and low signals in accordance with an embodiment of the present invention. The detector circuit 46 may alternatively be connected to other points in the power supply 12 where power is affected by reflected impedance from the remote device 14. The demodulation circuitry 47 may include filtering and conditioning circuitry (not shown in FIG. 3) to filter and condition the output of the sensor. For example, the demodulation circuitry 47 may include band pass filtering circuitry that functions primarily to attenuate high frequency oscillations that are above the frequency range of the data communications and/or to attenuate low frequency oscillations that are below the frequency range of the data communications, including without limitation any DC component in the signal. In some embodiments, the signal may be passed from filtering and conditioning circuitry to a comparator (not shown in FIG. 3) that converts the signals to a stream of high and low signals. The stream of high and low signals can be provided to a controller, such as controller 36, which interprets the high and low signals as a binary data stream in accordance with an embodiment of the present invention. To facilitate disclosure, specific circuits will be discussed below in connection with the corresponding communications methods.

In the illustrated embodiments, the remote electronic device 14 uses a bi-phase encoding scheme to encode data. With this method, a binary 1 is represented in the encoded data using two transitions with the first transition coinciding with the rising edge of the clock signal and the second transition coinciding with the falling edge of the clock signal. A binary 0 is represented by a single transition coinciding with the rising edge of the clock signal. Accordingly, the controller is configured to decode the comparator output using a corresponding scheme. As described below, the present invention provides a variety of alternative methods for modulating the biphase encoded data onto a power signal and for demodulating communications extracted from the power signal.

A remote device 14 in accordance with an embodiment of the present invention will now be described in more detail with respect to FIG. 2. The remote device 14 may include a generally conventional electronic device, such as a cell phone, a media player, a handheld radio, a camera, a flashlight or essentially any other portable electronic device. The remote device 14 may include an electrical energy storage device, such as a battery, capacitor or a super capacitor, or it may operate without an electrical energy storage device. The components associated with the principle operation of the remote device 14 (and not associated with wireless power transfer) are generally conventional and therefore will not be described in detail. Instead, the components associated with the principle operation of the remote device 14 are generally referred to as principle load 28. For example, in the context of a cell phone, no effort is made to describe the electronic components associated with the cell phone itself.

The remote device 14 generally includes a secondary coil 52, a rectifier 54, a communications transmitter 26 and a principle load 28. The secondary coil 52 may be a coil of wire or essentially any other inductor capable of generating electrical power in response to the varying electromagnetic field generated by the wireless power supply 12. The rectifier 54 converts the AC power into DC power. Although not shown, the device 14 may also include a DC-DC converter in those embodiments where conversion is desired. In applications where AC power is desired in the remote device, the rectifier 54 may not be necessary. The communications transmitter 26 of this embodiment includes a controller 56 and a communication load 30. In addition to its role in communications, the controller 56 may be configured to perform a variety of functions, such as applying the rectified power to the principle load 28. In some applications, the principle load 28 may include a power management block capable of managing the supply of power to the electronics of the remote device 14. For example, a conventional electronic device may include an internal battery or other electrical energy storage device (such as a capacitor or super capacitor). The power management block may determine when to use the rectified power to charge the device's internal battery and when to use the power to power the device. It may also be capable of apportioning the power between battery charging and directly powering the device. In some applications, the principle load 28 may not include a power management block. In such applications, the controller 56 may be programmed to handle the power management functions or the electronic device 14 may include a separate controller for handling power management functions.

With regard to its communication function, the controller 56 includes programming that enables the controller 56 to selectively apply the communication load 30 to create data communications on the power signal using a backscatter modulation scheme. In operation, the controller 56 may be configured to selectively couple the communication load 30 to the secondary coil 52 at the appropriate timing to create the desired data transmissions. The communication load 30 may be a resistor or other circuit component capable of selectively varying the overall impedance of the remote device 14. For example, as an alternative to a resistor, the communication load 30 may be a capacitor or an inductor (not shown). Although the illustrated embodiments show a single communication load 30, multiple communication loads may be used. For example, the system may incorporate a dynamic-load communication system in accordance with an embodiment of U.S. application Ser. No. 12/652,061 entitled COMMUNICATION ACROSS AN INDUCTIVE LINK WITH A DYNAMIC LOAD, which was filed on Jan. 5, 2010, and which is incorporated herein by reference in its entirety. Although the communications load 30 may be a dedicated circuit component (e.g. a dedicated resistor, inductor or capacitor), the communication load 30 need not be a dedicated component. For example, in some applications, communications may be created by toggling the principle load 28 or some portion of the principle load 28.

Although shown coupled to the controller 56 in the schematic representation of FIG. 2, the communications load 30 may be located in essentially any position in which it is capable of producing the desired variation in the impedance of the remote device 14, such as between the secondary coil 52 and the rectifier 54.

Figure 4:
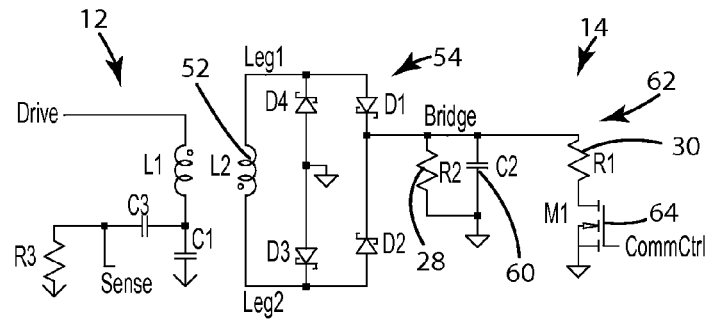
FIG. 4 is a simplified circuit diagram of one embodiment of a remote device.

FIG. 4 shows a circuit diagram of one embodiment of the present invention. It should be understood that the circuit diagram is a simplified diagram intended to represent the principle circuit components associated with the creation of communication signals in the remote device 14. In this embodiment, a single load is modulated to provide communications signals. The FIG. 4 embodiment generally includes a secondary coil 52, full bridge rectifier 54, a load 28, a bulk capacitor 60 and a communication subcircuit 62. The secondary coil 52 may be essentially any inductor, but is a coil of wire in the illustrated embodiment. The rectifier 54 is a full bridge rectifier including diodes D1-D4. Alternative rectifier configurations may be used. The load 28 represents the functional load of the remote device 14. The bulk capacitor 60 is selected to help smooth and filter power applied to load 28. The communication subcircuit 62 may include a load resistor 30 and a FET 64 connected in series between the load 28 and ground. Although not shown in FIG. 4, the controller 56 is operatively coupled to the FET 64 so that the controller 56 can selectively modulate the load resistor 30 to generate communication signals.

Figure 5:
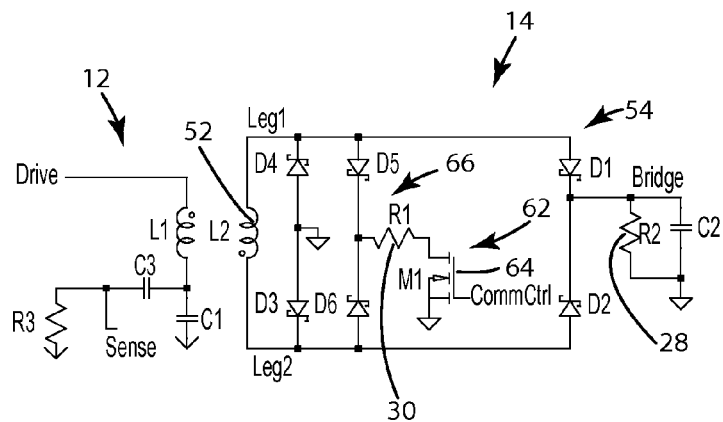
FIG. 5 is a simplified circuit diagram of a second embodiment of a remote device.

A variety of alternative communication circuits are shown in FIGS. 5-9. As with FIG. 4, FIGS. 5-9 are simplified circuit diagrams intended to show the principle circuit components associated with the creation of communication signals in the remote device. FIG. 5 shows an embodiment with a single communication load 30 that has an independent high side rectifier bridge 66. In this embodiment, a full bridge power rectifier 54 is provided to rectify power supplied to the load 28. The power rectifier 54 includes diodes D1-D4. The communication subcircuit 62 includes a communication load 30 and a FET 64 with an independent communication bridge 66. The independent communication bridge includes diodes D5-D6. In operation, the controller 56 (not shown in FIG. 5) operates FET 64 to modulate the communication load 30.

Figure 6:
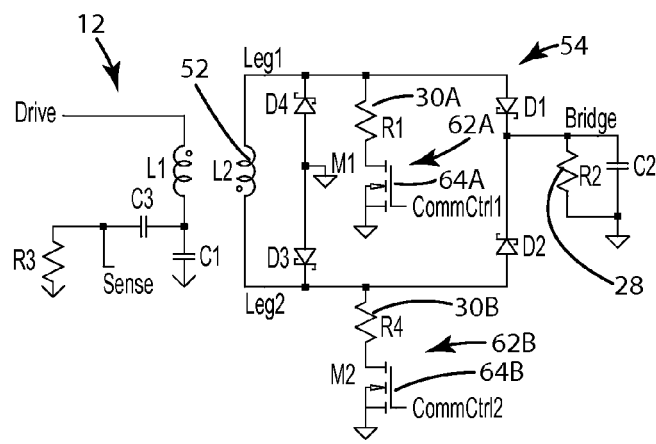
FIG. 6 is a simplified circuit diagram of a third embodiment of a remote device.

FIG. 6 shows another alternative embodiment in which two separate communication subcircuits 62*a*-62*b* are used to apply the communication load 30*a*-30*b*. In this embodiment, a full bridge rectifier 54 is provided to rectify power applied to the load 28. The full bridge rectifier includes diodes D1-D4. The first communication subcircuit 62*a* is connected to the common node of diodes D4-D1 to modulate the communication load during one half of the drive waveform. The first communication subcircuit 62*a* includes a communication load 30*a* and a FET 64*a*. The FET 64*a* is operatively coupled to the controller 56 (not shown in FIG. 6) so that the controller can selectively modulate the communication load 30*a*. The second communication subcircuit 62*b* is connected to the common node of diodes D3-D2 to modulate the communication load 30*b* during the other half of the drive waveform. In this embodiment, the second communication subcircuit 62*b* is essentially identical to the first communication subcircuit 62*a*. The second communication subcircuit 62*b* includes a communication load 30*b* and a FET 64*b*. The FET 64*b* is operatively coupled to the controller 56 so that the controller can selectively modulate the communication load 30*b*.

Figure 7:
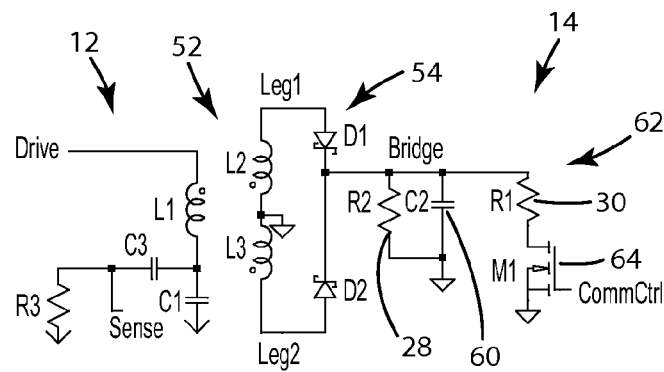
FIG. 7 is a simplified circuit diagram of a fourth embodiment of a remote device.
Figure 8:
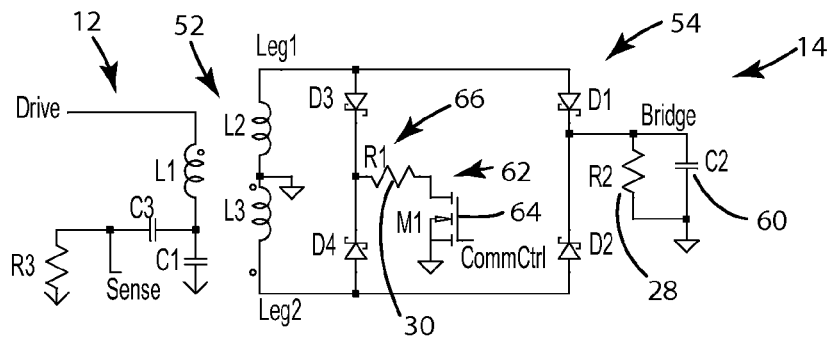
FIG. 8 is a simplified circuit diagram of a fifth embodiment of a remote device.
Figure 9:
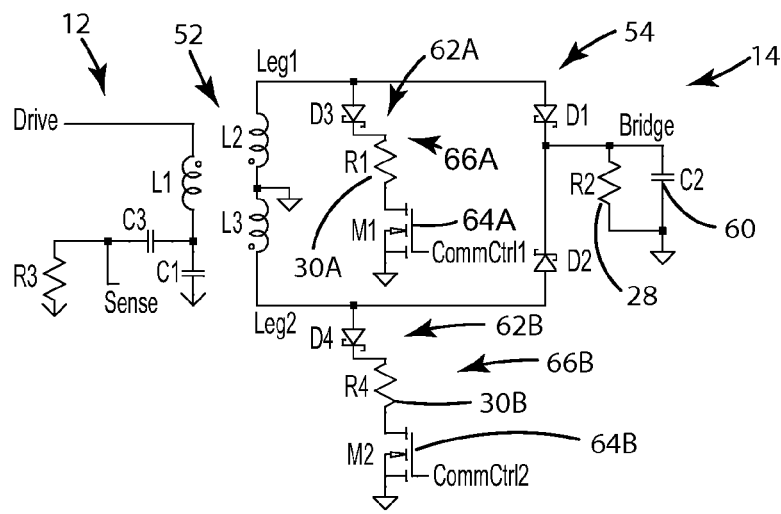
FIG. 9 is a simplified circuit diagram of a sixth embodiment of a remote device.

The present invention may also be used to modulate a load to apply communication signals to a split secondary coil (e.g. a center-tapped coil). For example, FIGS. 7-9 show various alternative remote device circuits. FIG. 7 shows a circuit with a single communication subcircuit and a shared full-wave rectifier. In this embodiment, the secondary coil 52 is a center-tapped, split coil. The communication subcircuit 62 includes a communication load 30 and a FET 64. The FET 64 is operatively coupled to the controller 56 (not shown in FIG. 7) so that the controller 56 can selectively modulate the communication load 30.

FIG. 8 is an alternative embodiment with a center-tapped secondary 52 and an independent communication bridge 66. In this embodiment, the power rectifier 54 includes diodes D1-D2. The communication subcircuit 62 is coupled to both sides of the secondary by separate diodes D3-D4. The communication subcircuit 62 includes a communication load 30 and a FET 64 for selectively coupling the communication load 30 to ground. The FET 64 is operatively coupled to controller 56 so that the controller 56 can selectively modulate the communication load 30.

FIG. 9 is yet another alternative embodiment. This embodiment includes a split secondary 52, a full-wave power rectifier 54, and two communication bridges 66*a*-66*b* with independent communication control. The power rectifier 54 includes diodes D1-D2 arranged between the split secondary 52 and the load 28. The first communication bridge 66*a* is connected to the node connecting the first side of the secondary 52 and diode D1 to modulate the communication load during one half of the drive waveform. The first communication bridge 66*a* includes diode D3 and a first communication subcircuit 62*a*. The first communication subcircuit 62*a* includes a communication load 30*a* and a FET 64*a*. The FET 64*a* is operatively coupled to the controller 56 (not shown in FIG. 9) so that the controller can selectively modulation the communication load. The second communication bridge 66*b* is connected to the node connecting the opposite side of the secondary 52 and diode D2 to modulate the communication load 30*b* during the other half of the drive waveform. The second communication bridge 66*b* includes diode D4 and a second communication subcircuit 62*b*. In this embodiment, the second communication subcircuit 62*b* is essentially identical to the first communication subcircuit 62*a*. The second communication subcircuit 62*b* includes a communication load 30*b* and a FET 64*b*. The FET 64*b* is operatively coupled to the controller 56 so that the controller can selectively modulation the communication load 30*b*.

Although the remote device 14 of FIG. 2 is described with a single controller that handles all of the control functions of the wireless power-related components, these functions may be divided across multiple controllers. For example, there may be a separate controller to handle communications. In applications with separate communication subcircuits, the remote device 14 may include separate controllers for operating the separate communication subcircuits.

II. Communication Methods

The present invention provides a variety of alternative communication methods that may provide improved performance in the context of wireless power transfer systems. These methods may be implemented using the wireless power transfer systems described above or any alternative systems capable of carrying out the methods of the present invention. For purposes of disclosure, the communication methods of the present invention will be described primarily in the context of a wireless power transfer system incorporating the simplified circuit diagram of FIG. 4. The following paragraphs describe alternative communications methods with reference to various waveform diagrams. These waveform diagrams include a first figure showing the data (i.e. the desired stream of ones and zeros), a second figure showing the data stream encoded using biphase modulation, and then a series of figures that show further details during a short period of time containing a transition from a logic low to a logic high. For purposes of this disclosure, the communications methods of the present invention are described in connection with a carrier waveform operating at 100 kHz, but the frequency may vary. Although the various communications methods are described in connection with a carrier waveform operating a single frequency (e.g. 100 kHz), it should be understood that the frequency of the carrier waveform may vary over time and that the communications methods of the present invention will automatically adapt to frequency changes. In the illustrated embodiments, the carrier waveform frequency may vary over time between 50 kHz and 200 kHz. For purposes of disclosure, the various communication methods are described in connection with data encoded at a fixed frequency of 2 kHz. This fixed frequency is merely exemplary and the data encoding frequency may vary from application to application.

In one embodiment, the communications are encoded by modulating a communication load at a rate that is a fraction of the drive frequency, such as an even-integer fraction. For example, in the illustrated embodiment, the communication resistor is modulated at one half the frequency of the carrier waveform. The modulation signal is created by combining the modulation clock and the encoded data. More specifically, in this embodiment, the modulation clock waveform is XORed with the encoded data waveform to produce the modulation signal. This methodology will be described in more detail with references to FIGS. 10A-10H. FIG. 10A shows a sample data stream of 1s and 0s. FIG. 10B shows the sample data stream encoded using a biphase encoding stream. Referring now to FIGS. 10C-10H, the modulation signal is created by combining the modulation clock and the encoded data. FIGS.

10C-10H show a short segment of the data stream during which there is a transition from a low signal to a high signal. FIG. 10C shows the carrier waveform, which as noted above is about 100 kHz for this illustration. FIG. 10D shows the modulation clock signal. The frequency of the modulation clock signal is one-half the frequency of the carrier (or about 50 kHz) in this illustration. The data stream is shown in FIG. 10E. As noted above, the data signal (FIG. 10D) is XOR with the encoded data signal (FIG. 10E) to produce the XOR waveform shown in FIG. 10F. As can be seen, the modulation clock waveform is copied when the encoded data is low and is inverted when the encoded data is high. When the modulated signal is applied to the carrier waveform, the resulting modulated carrier waveform is shown in FIG. 10G. Alternate time slicing of the resulting modulated carrier waveform is shown in FIG. 10H.

The communication signal may be received, demodulated and decoded using a variety of alternative systems and methods. For purposes of disclosure, the present invention will be described in connection with communication receiver 22 of FIG. 3 and the demodulation circuitry of FIG. 11. In operation of this embodiment, the current sensor 45 produces a signal that is representative of the current in the tank circuit 40 (see FIG. 3). The current sensor 45 may be a current sense transformer that produces a signal having a voltage that varies in proportion with the magnitude of the current in the tank circuit 40. As another alternative, the current sensor 45 may be an output taken from a divider having a scaling resistor and capacitor as shown in FIGS. 4-9. As noted above, the current sensor 45 may be replaced by essentially any detector or similar circuit component capable of producing a signal that is representative of a characteristic of power in the power supply 12 that is affected by the reflected impedance of the remote device 14.

Figure 11A:
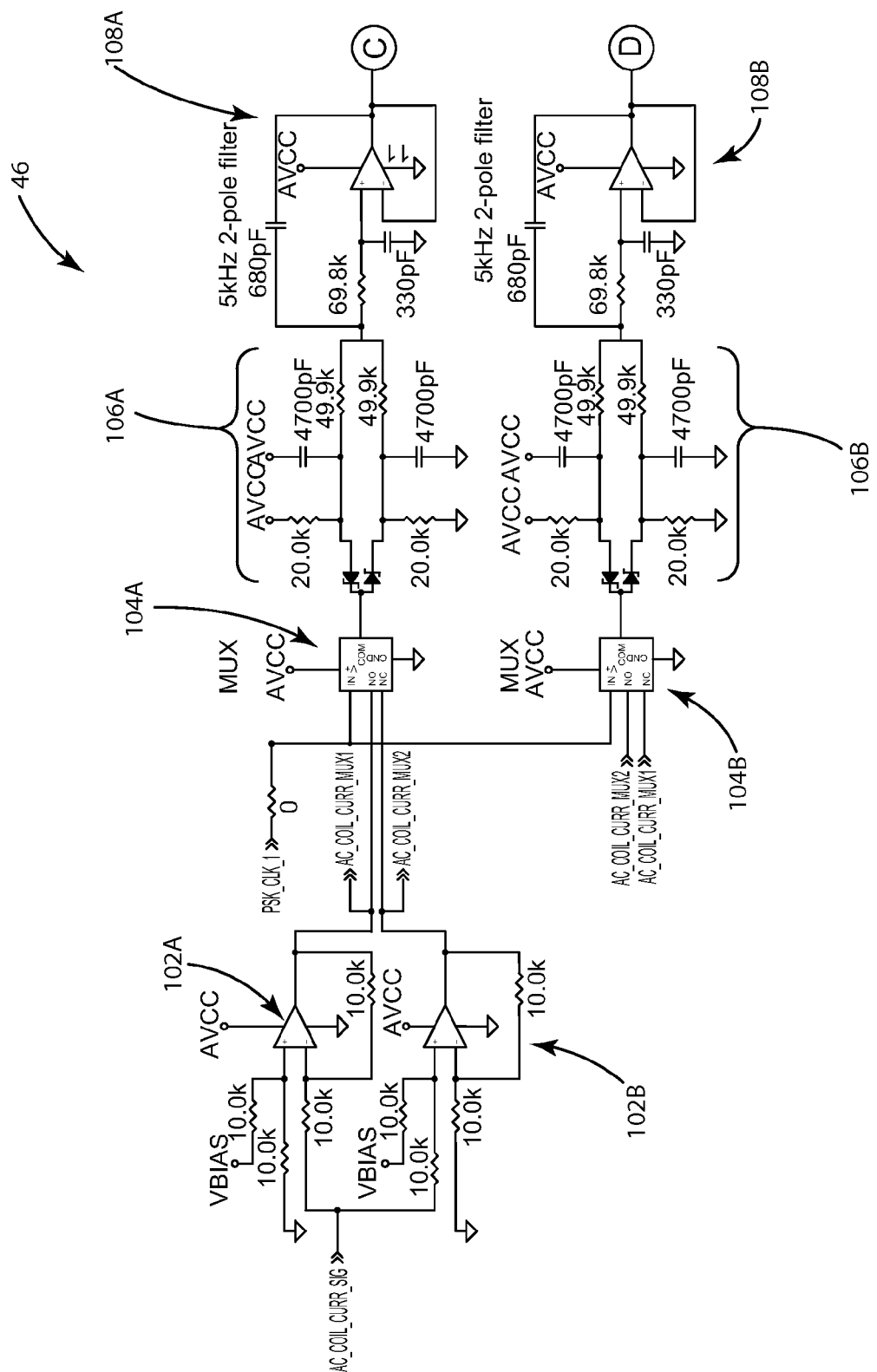
FIG. 11 is a simplified circuit diagram showing a portion of a first detector circuit.
Figure 11B:
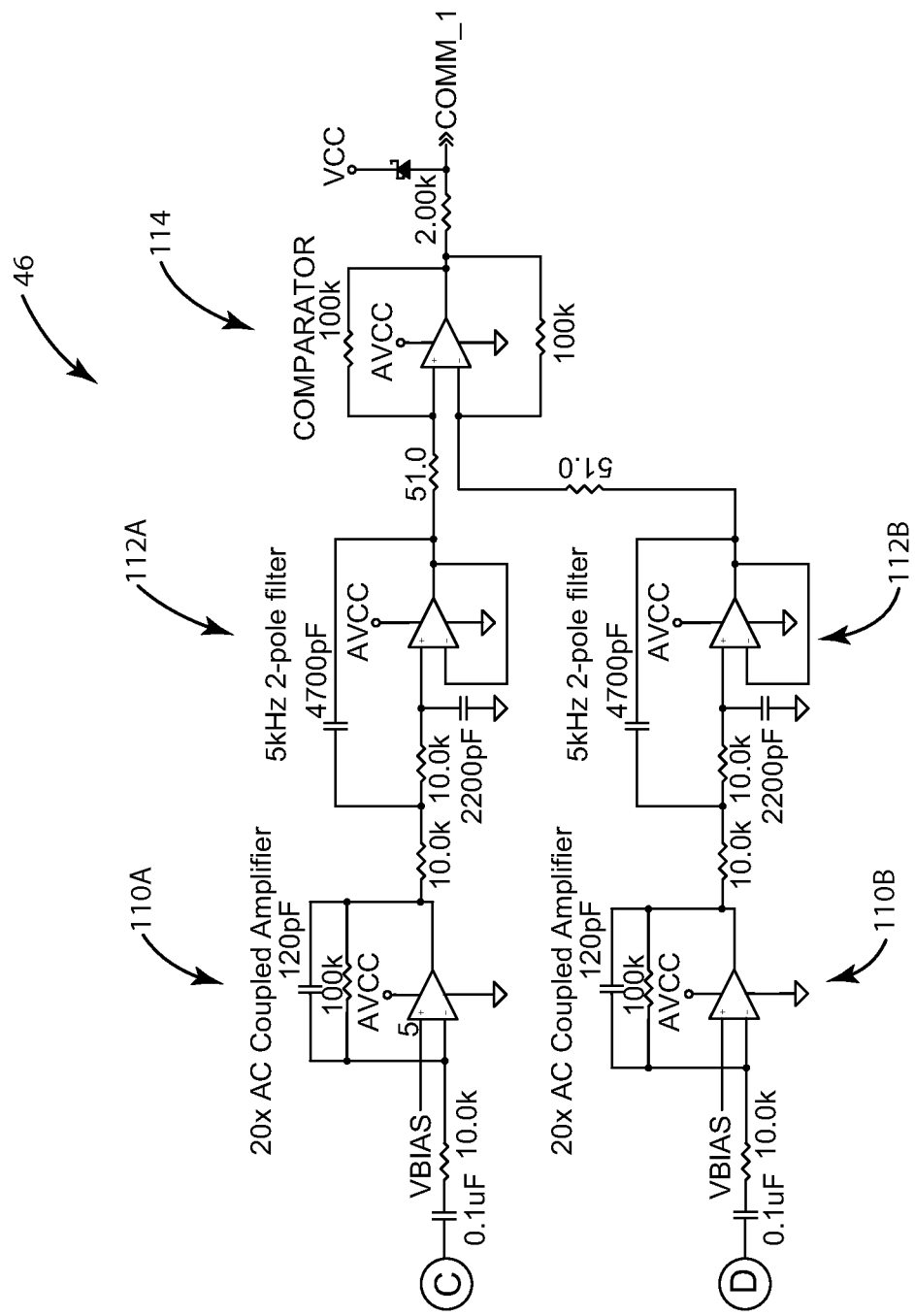

In this embodiment, the detector circuit 46 includes a pair of amplifiers 102a-102b that produce a buffer copy and an inverted buffer copy of the signal output by the current sensor (see FIG. 11). As shown, in this embodiment, the current sensor signal may be passed to both an amplifier and an inverting amplifier arranged in parallel with respect to one another. The output of the amplifier and the inverting amplifier may be passed to a pair of multiplexors 104a-104b that are coupled to a time slicing clock that is synchronized with the modulation clock in the remote device 14. The time slicing clock controls whether the buffer copy or the inverted copy of the current signal is passed to the remainder of the detector circuitry. In this embodiment, the clock signal is synchronized to the drive frequency divided by two. As shown, in this embodiment, the two multiplexors 104a-104b include opposite NO/NC inputs to provide a differential signal. As an alternative to flipping the NO/NC inputs, the multiplexor clocking may be inverted to provide a differential signal. In some cases, it may be desirable to clock the multiplexors 104a-104b with a signal that is a quadrature copy of the drive signal. The 90 degree phase shift may allow the circuitry to better capture the signal. Although the multiplexors of the illustrated embodiment have two inputs, the multiplexors 104a-104b could alternatively have a single input and the output may be left floating on the alternate clock phase. This could reduce the signal strength of the amplifier chain. In this embodiment, the clock signal may be derived from a variety of sources, such as the drive signal, the primary coil voltage, the primary coil current or a 90 degree shifted version of any of the foregoing.

Referring again to FIG. 11, multiplexor 104a passes the buffer copy during the "A" time slices and passes the inverted copy during the "B" time slices, and multiplexor 104b passes the buffer copy during the "B" time slices and passes the inverted copy during the "A" time slices.

In the detector circuit of FIG. 11, the output of each multiplexor 104a-104b is passed through a separate amplifier chain. In the illustrated embodiment, the output of each multiplexor 104a-104b is passed to separate averaging circuitry 106a-106b. Each of these averaging circuits 106a-106b outputs the average of the minimum and maximum of its respective input, which may provide improved performance over a straight average in some applications because it may be less influenced by the shape of the waveform and more sensitive to extreme values. Although potentially beneficial in some applications, the outputs need not be averages of the minimum and maximum. For example, in some applications, the averaging circuits 106a-106b may alternatively output a straight average of their respective input signals.

In the illustrated embodiment, the outputs of the averaging circuits 106a-106b are passed to separate low pass filters 108a-108b. In this embodiment, the filters 108a-108b may be two pole 5 kHz low pass filters. These low pass filters 108a-108b function primarily to remove the AC components of the signal above the communication frequency range. Although this function is performed in the illustrated embodiment with op-amps, the op-amps may be replaced by alternative filtering circuitry, such as a passive filter or a digital filter.

In some applications, it may be desirable to amplify the outputs of the low pass filters 108a-108b. In the illustrated embodiment, the outputs of the low pass filters 108a-108b are passed to separate amplifiers 110a-110b. In the illustrated embodiment, the amplifiers 110a-110b are AC coupled amplifiers that amplify the filtered signal, maintaining a center point around Vbias. In this embodiment, the AC coupling removes any DC offset and serves as a single pole high pass filter.

The outputs of the amplifiers 110a-110b are passed to separate low pass filters 112a-112b. These low pass filters 112a-112b remove AC components of the signal above the communication frequency range and help to remove noise imparted by the AC amplifier 110a-110b. Although low pass filters 112a-112b are implemented in the illustrated embodiment with op-amps, the op-amps may be replaced by alternative filtering circuitry, such as a passive filter or a digital filter. In some applications, the signal-to-noise ratio of the outputs of the amplifiers may be sufficient so that low pass filters 112a-112b are unnecessary.

In the illustrated embodiment, the outputs of the final low pass filters 112a-112b are separately passed to a comparator 114. The comparator 114 combines the differential signals from the two amplifier chains back into a single, "digitized" signal that can be readily decoded by a microcontroller, such as controller 36. Referring to FIG. 10G, when logic low is being sent, time slices "A" have a larger negative peak and time slices "B" have a larger positive peak. This condition results in a low amplifier output. Conversely, when logic high is being sent, time slices "A" have a larger positive peak and time slices "B" have a larger negative peak. This condition results in a high amplifier output. The stream of high and low signals output by the comparator may be decoded using the same scheme used to encode the data in the remote device 14, which in this embodiment is a biphase encoding scheme.

As an alternative to the dual-chain circuitry of FIG. 11, the detector circuit 46 may alternatively incorporate a single ended detection chain. In such alternatives, the detector circuit may include only the topmost chain of FIG. 11. The dual-chain circuitry of FIG. 11 may provide improved performance in some applications because the differential pair of amplifier chains provides improved signal-to-noise ratio as one signal is increasing in voltage while the other is decreasing. As a result, DC drift is unlikely to distort the signal. The comparator of this alternative embodiment is configured to provide a high or low output based on a comparison of the amplitude of the input signal with a reference signal. More specifically, the comparator may include a first input that receives the signal from the single detection chain and a second input that is coupled to a reference signal, Vbias. The reference signal may be set to be slightly lower than the DC component of the amplified signal. Accordingly, the comparator output will remain high when no communication is present in the signal. If communication is present, then the comparator output toggles between high and low in correspondence with the communication signals. The output of the comparator 114 is passed to the controller 36 for decoding. In this case, decoding is achieved using a biphase decoding scheme.

In an alternative embodiment, communications are encoded by modulating a communication load at a rate that is a fraction of the drive frequency, similar to the embodiment described above with respect to FIGS. 10A-G and 11, with some exceptions. Rather than modulating the communication load during a full cycle of the drive waveform, shown for example in FIG. 10F, the communication load in this embodiment is modulated during a fraction of the drive waveform, such as one-half the drive waveform.

Figure 16:
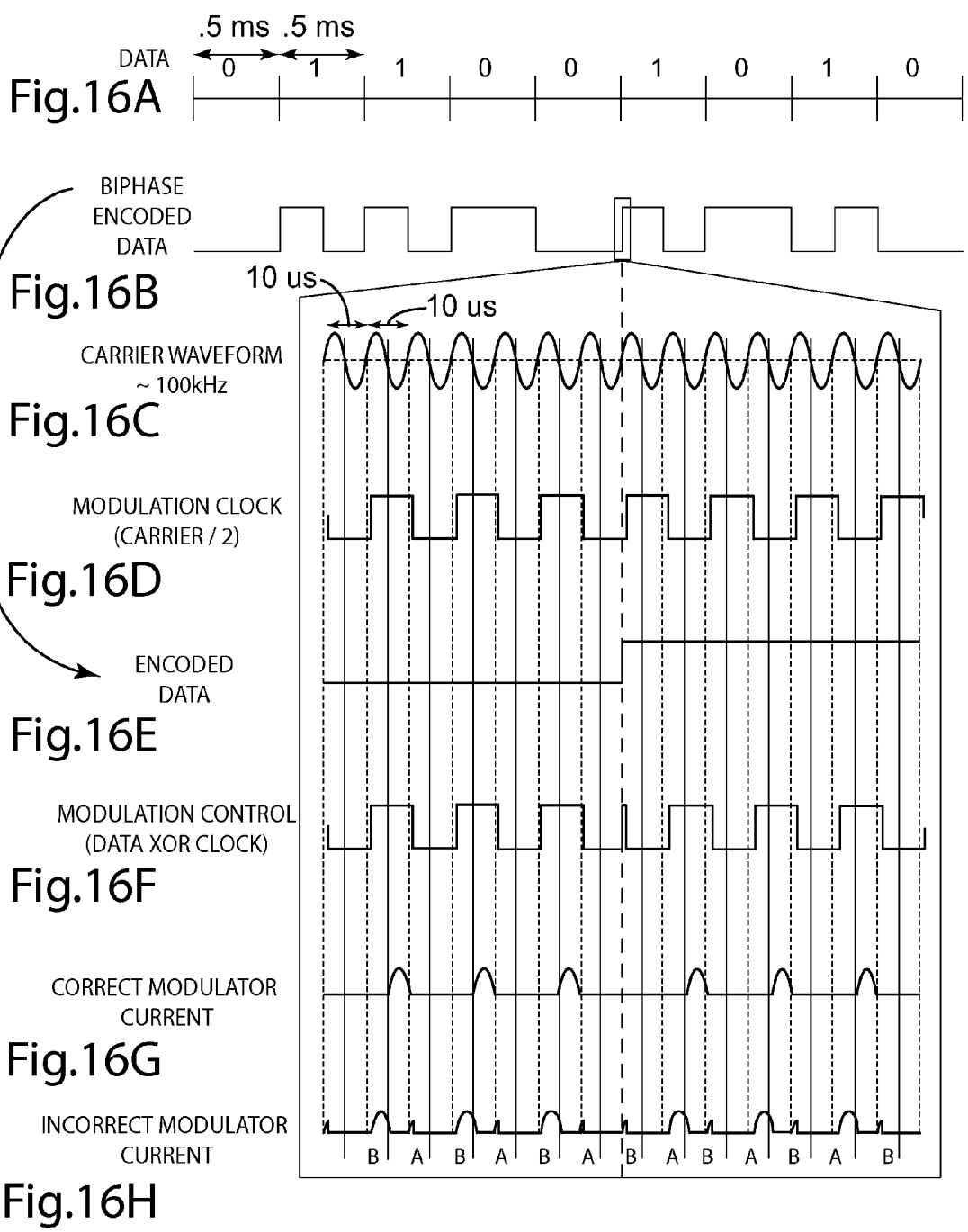
FIG. 16 is a series of waveform diagrams representative of a fourth communication method.

Referring to FIGS. 16A-H, in the illustrated embodiment, a communication load is modulated at one-half the frequency of the carrier waveform. The modulation clock waveform may be XORed with the encoded data waveform to produce a modulator control waveform. FIGS. 16C-H show a short segment of the data stream during which there is a transition from a low signal to a high signal. FIG. 16C shows the carrier waveform, which as noted above is about 100 kHz for this illustration. FIG. 16D shows the modulation clock waveform having a frequency that is one-half the frequency of the carrier (or about 50 kHz) in this illustration. The data stream is shown in FIG. 16E, which after being XORed with the modulation waveform yields the XOR waveform of FIG. 16F. It should be appreciated that up to this point the features of this alternative embodiment are substantially similar to the embodiment described with respect to FIGS. 10A-G.

As described in the previous embodiment, the communication load may be modulated according to the XORed waveform for a full cycle of the carrier waveform, or in other words, at a 50% duty cycle using a modulated clock waveform having a frequency that is one-half the carrier frequency. However, in this alternative embodiment, the XORed waveform is applied for approximately one-half the cycle of the carrier waveform, or in other words, at a 25% duty cycle using a modulated clock waveform having a frequency that is one-half the carrier frequency. Thus, the communication load may be applied for less time than in the previous embodiment, and to increase the magnitude of either a peak or a tough—but not both—of every other waveform of the carrier waveform in order to communicate the data.

This 25% duty cycle modulation may be achieved by generating an XOR waveform similar to the XOR waveform illustrated in the embodiments of FIGS. 10A-G; but rather than applying the XOR waveform during a full cycle of the carrier waveform, the XOR waveform may be applied during one-half of each cycle of the carrier waveform. For example, using the communication circuits of FIGS. 6 and 9, applying the XOR waveform for one-half of each cycle of the carrier waveform may be accomplished by selectively modulating one of the communication loads 30a-30b—not both—or put differently, modulating one leg of the secondary coil 52 instead of both legs. It should be appreciated that although this embodiment implements a 25% duty cycle using an XOR waveform similar to that of the embodiments above, the 25% duty cycle may be achieved instead by modifying the modulation clock waveform to have a 25% duty cycle and XORing it with the encoded data waveform. Using the communication circuits of FIGS. 4-5 and 7-8, for example, the communication load 30 may be modulated according to this XORed waveform in order to apply the communication load 30 for approximately one-half of each cycle of the carrier waveform.

Propagation delays inherent to the electronics of this embodiment, and other embodiments, may cause the modulation clock to be delayed with respect to the carrier waveform. In the illustrated embodiment of FIGS. 16C-D, this propagation delay can be seen by the slight shift in the modulation clock waveform with respect to the zero crossing of the carrier waveform. In some embodiments, for example, this propagation delay may affect when the communication load is applied relative to the carrier waveform, and whether the remote device 14 attempts to adapt or compensate for the delay.

In the illustrated embodiments of FIGS. 16A-H, the propagation delay may affect the choice of which leg of the secondary coil 52 to modulate in order to implement 25% duty cycle modulation. Using the circuit topology of FIG. 6 as a reference, the current through the load resistor 30a (coupled to the first leg of the secondary coil 52) during modulation cycles is shown in FIG. 16H, and the current through the load resistor 30b (coupled to the second leg of the secondary coil 52) during modulation cycles is shown in FIG. 16G. Because the modulation clock waveform of FIG. 16D is synced with the carrier waveform at the first leg of the secondary coil 52, a propagation delay prevents full modulation of the load resistor 30a as illustrated by the chopped modulator current in FIG. 16H. As a result, in order to account for the effects of propagation delay and achieve full modulation at 25% duty cycle, a communication load may be modulated on a leg of the secondary that is opposite the leg which generates the modulation clock waveform. For example, in the illustrated embodiment of FIG. 16G, full modulation is achieved at 25% duty cycle by modulating the load resistor 30b coupled to the second leg of the secondary coil 52.

Similar to other alternative embodiments discussed herein, the communication load of this embodiment may be one or more impedance elements, such as a load resistor or one or more alternative components. For example, the communication load may be resistive, capacitive, or inductive, or a combination thereof. Although FIGS. 4-9 show a load resistor 30, this embodiment may in some cases function better with a load capacitor in place of the load resistor 30.

Figure 17:
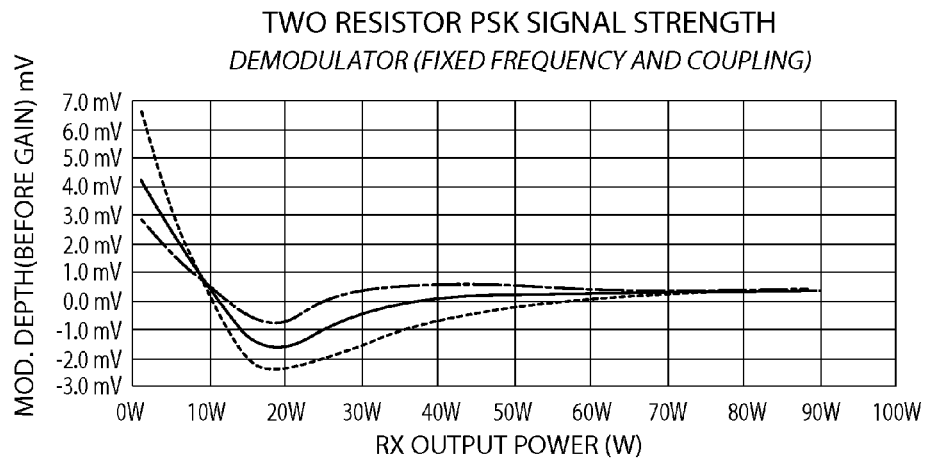
FIG. 17 is a plot of signal strength vs. output power for the first detector circuit.
Figure 18:
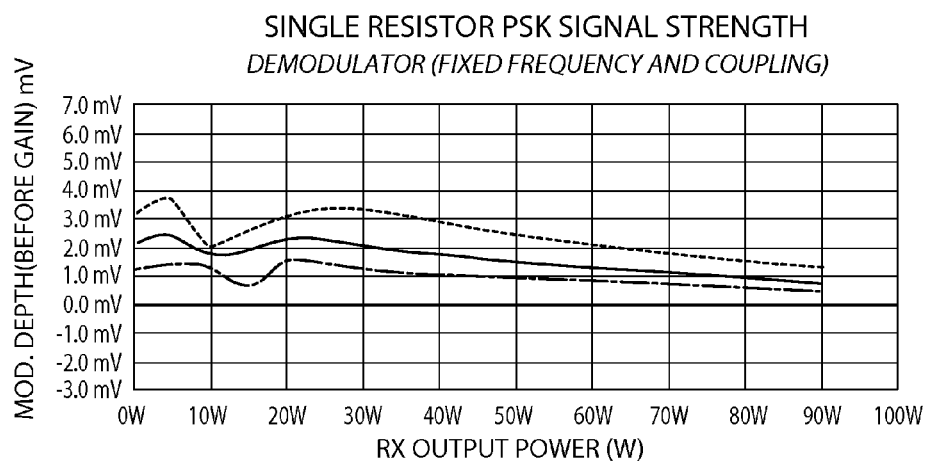
FIG. 18 is a plot of signal strength vs. output power for a fourth detector circuit.

The two plots of FIGS. 17 and 18 illustrate potential differences between embodiments of FIGS. 16A-H that modulate at 25% duty cycle using a single load resistor 30a and a 50% duty cycle modulator. FIG. 17 shows communication nulls or inversion that may result from depleting the energy in the coils for two consecutive cycles with embodiments using a 50% duty cycle modulator. Specifically, at output powers of approximately 15-30 W, the modulation depth may invert or go below 0.0 mV, causing a null communication zone. As shown in FIG. 18, with a 25% duty cycle modulator applying a communication load to one side of the coil, the signal strength decreases in some zones due to the modulation, but inversion and null communication zones are avoided. In one aspect, the present invention may provide communication circuitry that avoids communication inversion. Further potential attributes of the 25% duty cycle embodiments may be a reduction or elimination of audible noise during communication, though 50% duty cycle embodiments may also reduce or eliminate audible noise.

Figure 19A:
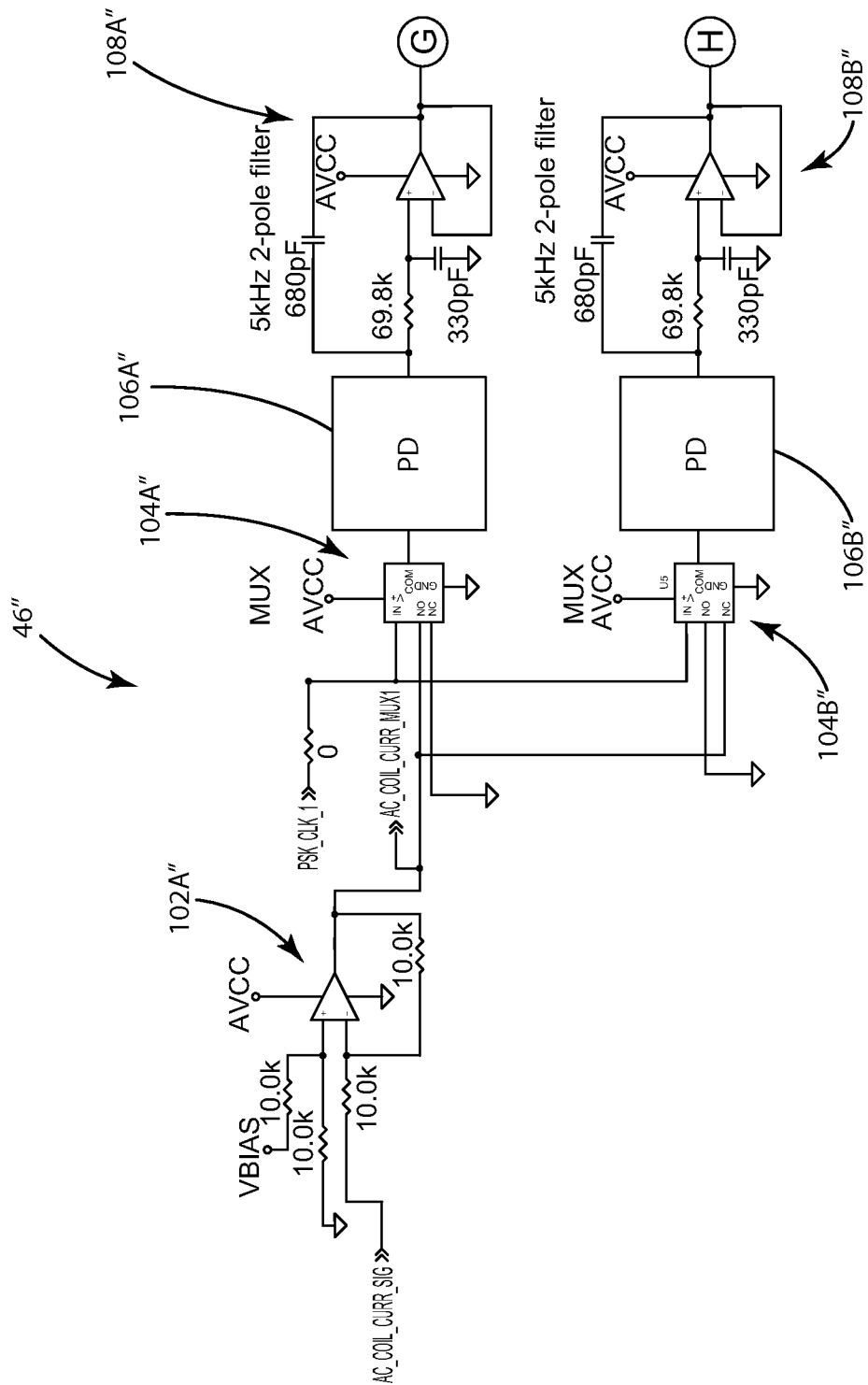
FIG. 19 is a simplified circuit diagram showing a portion of the fourth detector circuit.
Figure 19B:
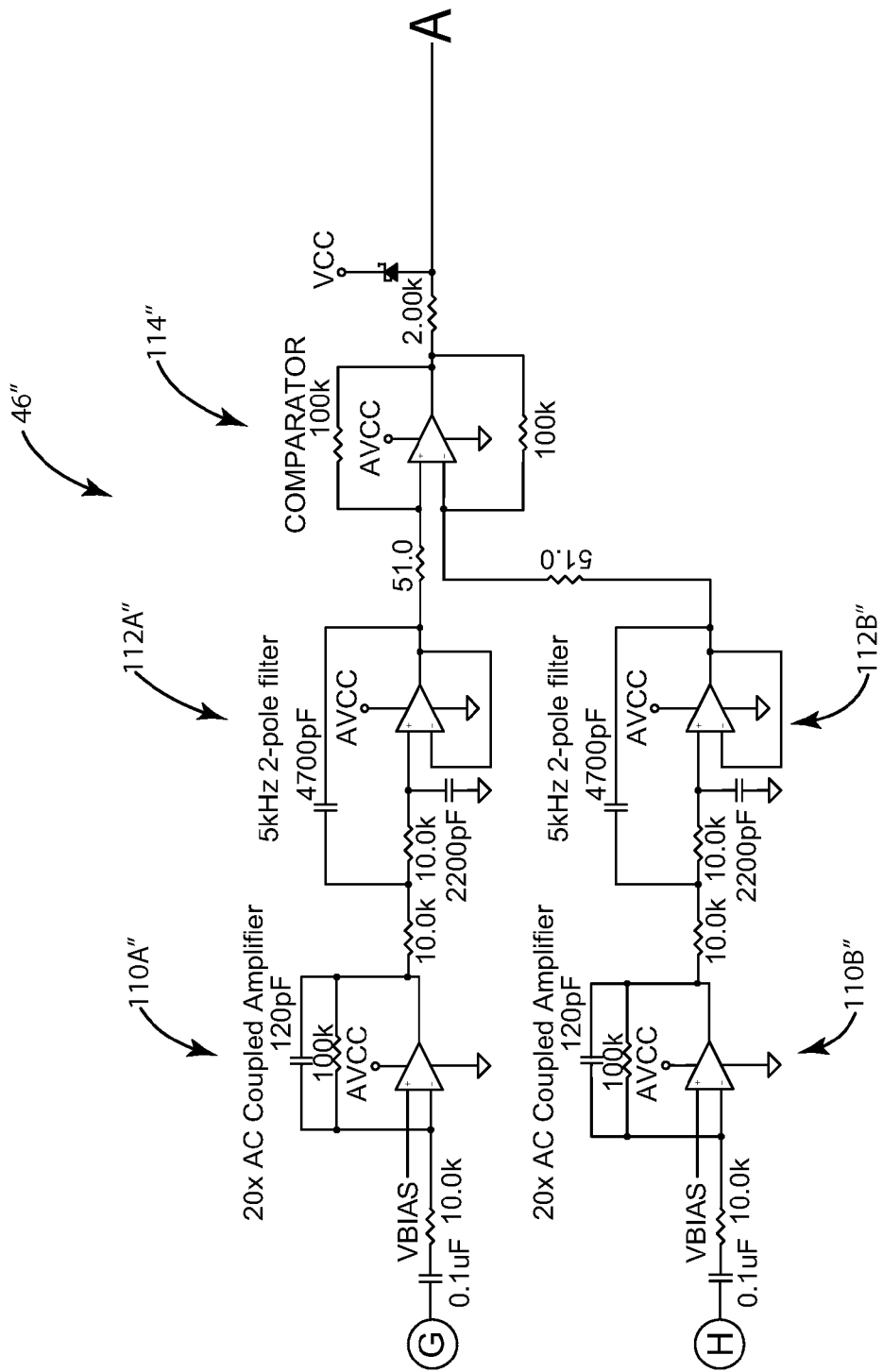
Figure 20A:
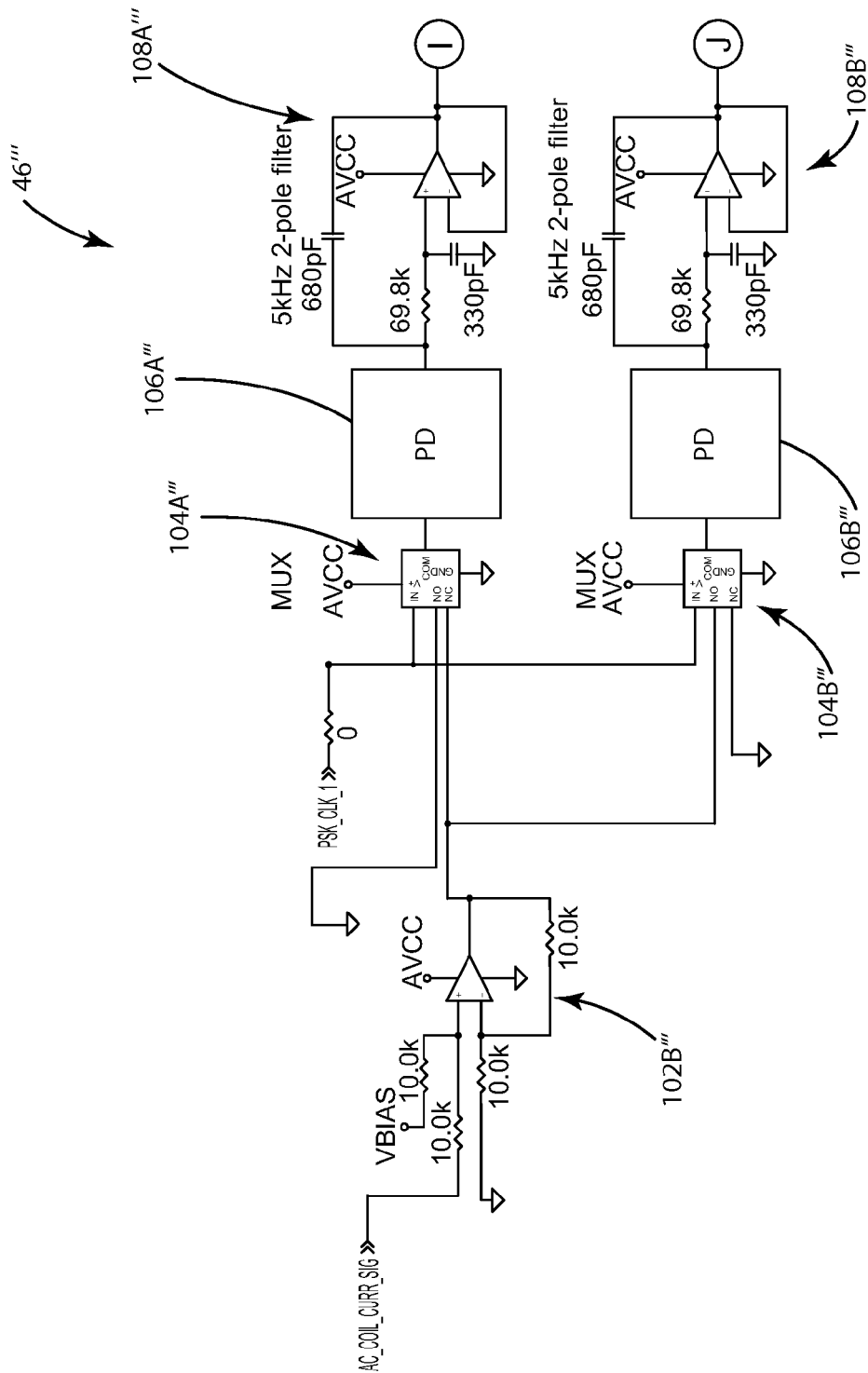
FIG. 20 is a simplified circuit diagram showing a portion of the fourth detector circuit.
Figure 20B:
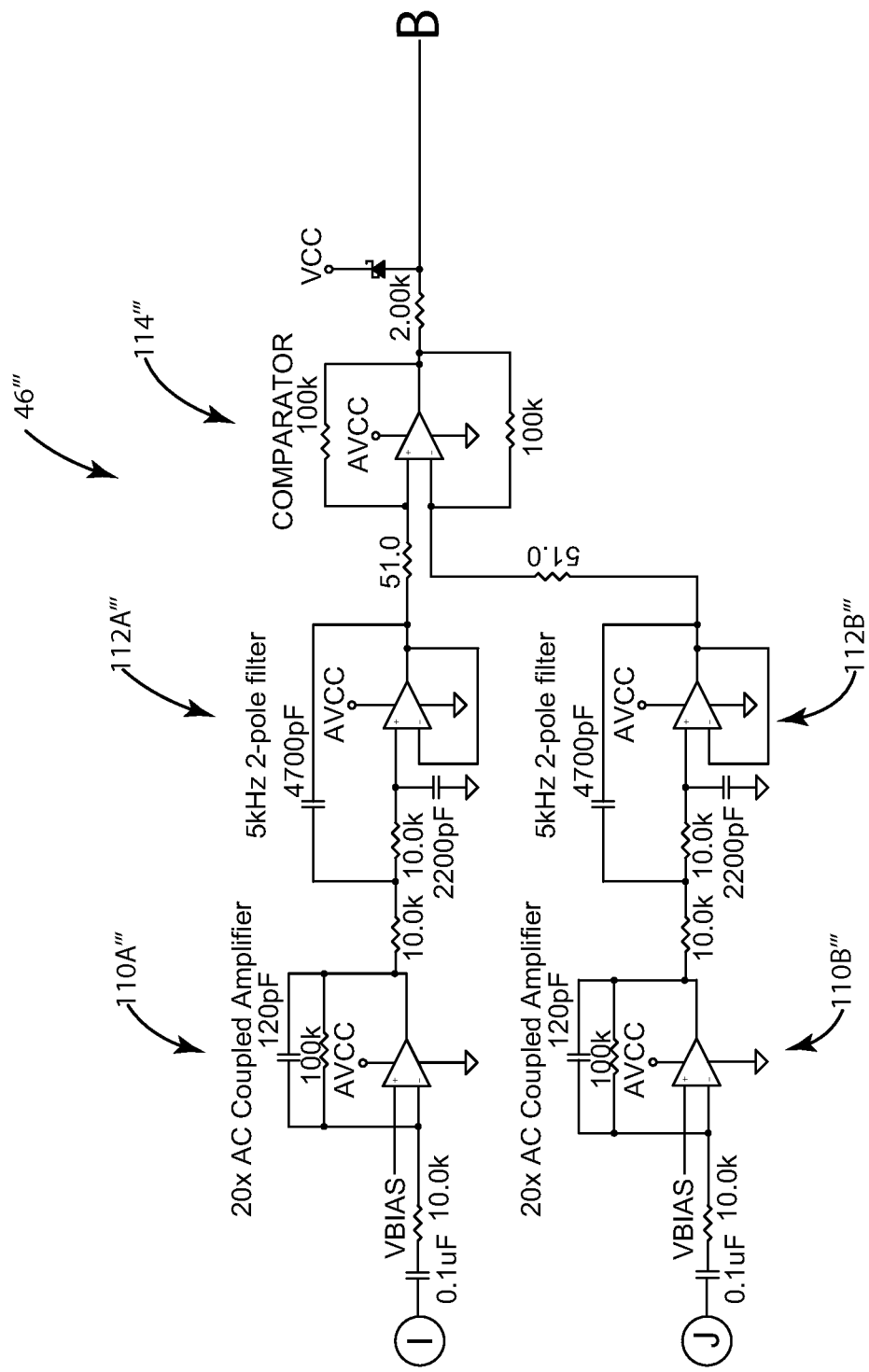

Referring now to FIGS. 19 and 20, the communication signal may be received, demodulated, and decoded using systems and methods similar to the embodiments described above with respect to FIG. 11, with some exceptions. Instead of averaging circuitry 106*a-b*, this embodiment uses peak detector circuitry 106*a-b*" and 106*a-b*'" and includes two detector circuits 46" and 46'" to demodulate the communication signal. Otherwise, this embodiment and its alternatives are similar to other embodiments described herein.

As discussed above, in embodiments that utilize 25% duty cycle modulation, the communication load may be applied during one-half of the carrier wave cycle. As a result, the modulation may cause a level shift to be reflected through the inductive coupling to the wireless power supply that generally affects either the peaks or the troughs—but not both—of the current sensed by the current sensor. In other words, with 25% duty cycle modulation, (a) levels of the peak current or voltage through the primary coil from even to odd cycles may shift, or (b) levels of the trough current or voltage through the primary coil from even to odd cycles may shift. If the dot orientation (e.g. winding orientation) of the primary coil 42 with respect to the secondary coil 52 of the remote device is unknown, it may not be known whether the level shift occurs in the trough or the peak. Accordingly, this embodiment utilizes two detector circuits 46" and 46'" to sense level shifts in either the peaks or the troughs due to communication load modulation. The respective outputs (A and B) of the two detector circuits 46" and 46'" are then combined, such as being ORed together, to yield a digital representation of the communication signal modulated through the inductive coupling. In alternative embodiments in which the dot orientation is known, a single detector circuit may be used to detect level shifts in either the peaks or the troughs, whichever is expected, depending on the known dot convention and which leg of the secondary 52 is being modulated. It should be appreciated that knowing the dot orientation may be unnecessary in embodiments that use 50% duty cycle modulation because level shifts due to modulation of the communication load occur in both the peaks and the troughs.

The first and second detector circuits 46" and 46'" are now described in further detail. The first detector circuit 46" produces a buffer copy of the signal output by the current sensor, and a second detector circuit 46'" produces an inverted buffer copy of the signal output by the current sensor. In this way, the first detector circuit 46" samples and time slices peaks of the carrier wave to detect a level shift in response to application of a communication load, and the second detector circuit 46'" samples and time slices the troughs of the carrier wave to detect a level shift in response to application of a communication load.

Referring again to FIGS. 16A-H along with FIG. 19, the multiplexor 104*a*" of detector 46" passes a buffered copy during "A" time slices, and the multiplexor 104*b*" of detector 46" passes a buffered copy during "B" time slices. Accordingly, the "A" time slices and the "B" time slices are passed through a separate amplifier chain, which with some exceptions may be similar to the amplifier chain of the illustrated embodiment of FIG. 11. In the illustrated embodiment of FIG. 19, the outputs of the multiplexors 104*a-b*" are passed to separate peak detectors 106*a-b*". Each of the peak detectors 106*a-b*" outputs the peak value of its respective input during a time slice. This peak detection may provide improved signal detection by capturing level shifts resulting from modulation of the communication load. The peak detector may also cancel out any asymmetry imposed by half-bridge driver hardware of the wireless power supply. For purposes of disclosure, the peak detector 106*a-b*" is used in the illustrated embodiment of FIG. 19, but the peak detector may also be implemented in other embodiments described herein. In further alternatives, the peak detector may be replaced by a trough detector, which may detect minimum conditions rather than maximum conditions in the signal.

The outputs of the peak detectors 106*a-b*" are each passed through separate amplifier chains as discussed above, and eventually compared against each other using a differential amplifier, such as comparator 114". If a level shift is detected between the peaks of the buffered, non-inverted signal in the "A" time slices as compared to the "B" time slices, the comparator 114" outputs a "digitized" signal that can be readily decoded by a microcontroller, such as controller 36. As an example, if the peak value of the signal during the "A" time slices is higher than the peak value of the signal during the "B" time slices, a logic high will be output from the detector 46". Conversely, if the peak value of the signal during "A" time slices is lower than the peak value of the signal during the "B" time slices, then a logic low will be output from the detector 46".

Turning to the illustrated embodiment of FIG. 20, the detector 46'" detects the opposite of detector 46"; rather than detecting peaks in the signal, detector 46'" detects troughs or minimums in the signal. For example, by detecting a level shift in the troughs, detector 46'" may demodulate data encoded within the signal.

In particular, the multiplexor 104*a*'" of detector 46'" passes a buffered inverted copy of the signal during "A" time slices, and the multiplexor 104*b*'" passes a buffered inverted copy of the signal during "B" time slices. Accordingly, the "A" time slices and the "B" time slices are passed through a separate amplifier chain, which with some exceptions is similar to the amplifier chain of the illustrated embodiment of FIG. 11. In the illustrated embodiment of FIG. 20, the outputs of the multiplexors 104*a-b*'" are passed to separate peak detectors 106*a-b*'", which in detector 46'" detect troughs or minimums in the signal. Each of the peak detectors 106*a-b*'" outputs the peak value of the inverted signal (the trough of the non-inverted signal) of its respective input during a time slice.

Similar to detector 46", the outputs of the peak detectors 106*a-b*'" are each passed through separate amplifier chains, and eventually compared against each other using a differential amplifier, such as comparator 114". As before, if a level shift is detected between the troughs of the buffered, non-inverted signal in the "A" time slices as compared to the "B" time slices, the comparator 114'" outputs a "digitized" signal that can be readily decoded by a microcontroller.

As described above, without knowing the dot orientation of the primary with respect to the secondary, it may be uncertain whether modulation of the communication load at 25% duty cycle will effect a level shift in the troughs or the peaks of the signal. As a result, the respective outputs (A and B) of both detector 46" and detector 46'" may be monitored by a microcontroller so that the signal can be detected and readily decoded.

As an example, using 25% duty cycle modulation by modulating the second leg of the secondary coil (FIG. 16G), operation of the detectors 46" and 46'" would yield the following results. It should be appreciated that results may differ depending on the manner of modulating the communication load. In the example embodiment of FIGS. 16A-G, as applied to the illustrated embodiment of FIGS. 19 and 20, detector 46" would not detect a level shift between peak values of the buffered, non-inverted signal during the "A" time slices and the "B" time slices. As shown in FIG. 16G, the communication load is being modulated during the trough cycle of the carrier wave, not the peak cycle, and therefore the peaks of the signal are generally unaffected by modulation of the communication load.

Detector 46", on the other hand, would detect a level shift between the peak values of the buffered, inverted signal during the "A" time slices and the "B" time slices. Because the communication load is being modulated during the trough cycle of the carrier wave, the peaks of the inverted form of the signal (troughs of the non-inverted signal), as measured by peak detectors 106a-b''', would identify a level shift between the "A" time slices and the "B" time slices, and output the level shift as a "digitized" signal to be decoded by a microcontroller as described previously.

In another alternative embodiment, communications are encoded by modulating a communication load at a rate that is a multiple of the drive frequency, such as an even-integer multiple. For example, in the illustrated embodiment, the communication resistor is modulated at four times the frequency of the carrier waveform. This embodiment may include a phase lock loop ("PLL") to generate a modulation clock waveform that remains in phase with the carrier waveform. FIG. 12A shows a sample data stream of 1s and 0s. FIG. 12B shows the sample data stream encoded using a biphase encoding stream. Referring now to FIGS. 12C-12I, the modulation signal is created by combining the modulation clock and the encoded data using different functions for the positive and negative halves of each cycle of the waveform. More specifically, in this embodiment, during the positive half of the carrier waveform, the modulation clock waveform is XORed with the encoded data waveform, and during the negative half of the carrier waveform, the modulation clock waveform is XOR#ed with the encoded data waveform. This may simplify demodulation by the wireless power supply. FIG. 12C shows the carrier waveform, which as noted above is about 100 kHz. FIG. 12D shows the modulation clock signal. In this embodiment, the frequency of the modulation clock signal is four times the frequency of the carrier or about 400 kHz in this illustration. The data stream is shown in FIG. 12E. As noted above, this illustration shows a short portion of the data stream including a single transition for low to high. The XOR waveform is shown in FIG. 12F and the XOR# waveform is shown in FIG. 12G. The composite waveform resulting from alternately XORing or XOR#ing the data signal with the modulation clock signal provides the modulated signal as shown in FIG. 12H. When the modulated signal is applied to the carrier waveform, the resulting modulated carrier waveform is shown in FIG. 12I. It should be noted that FIG. 12I represents an idealized waveform. In practice, the modulated signal is unlikely to produce instantaneous variations in the primary current. Instead, the current is likely to take some time to transition and the actual waveform is likely to have transition regions rather than clean jumps between time slices.

Figure 13A:
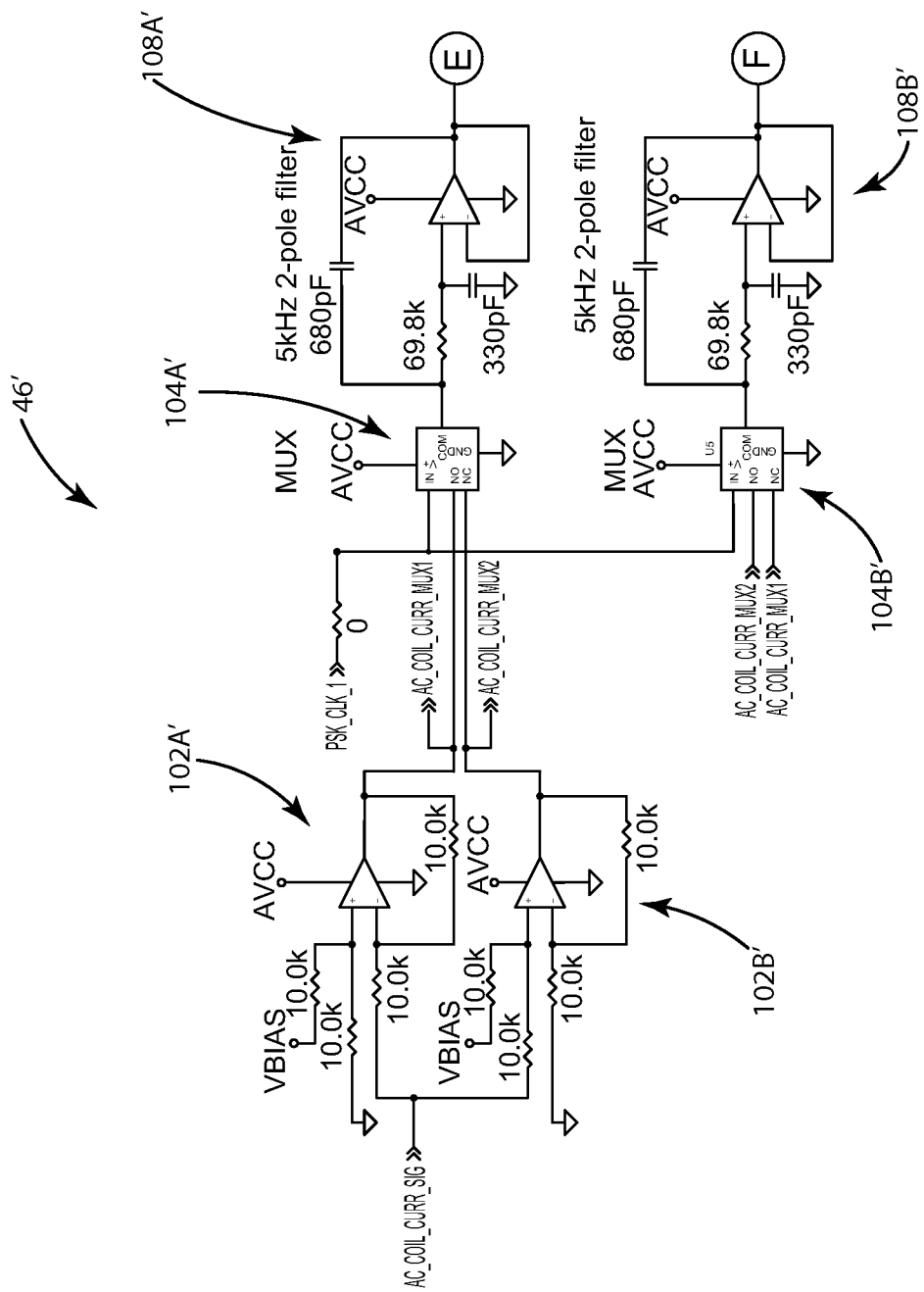
FIG. 13 is a simplified circuit diagram showing a portion of a second detector circuit.
Figure 13B:
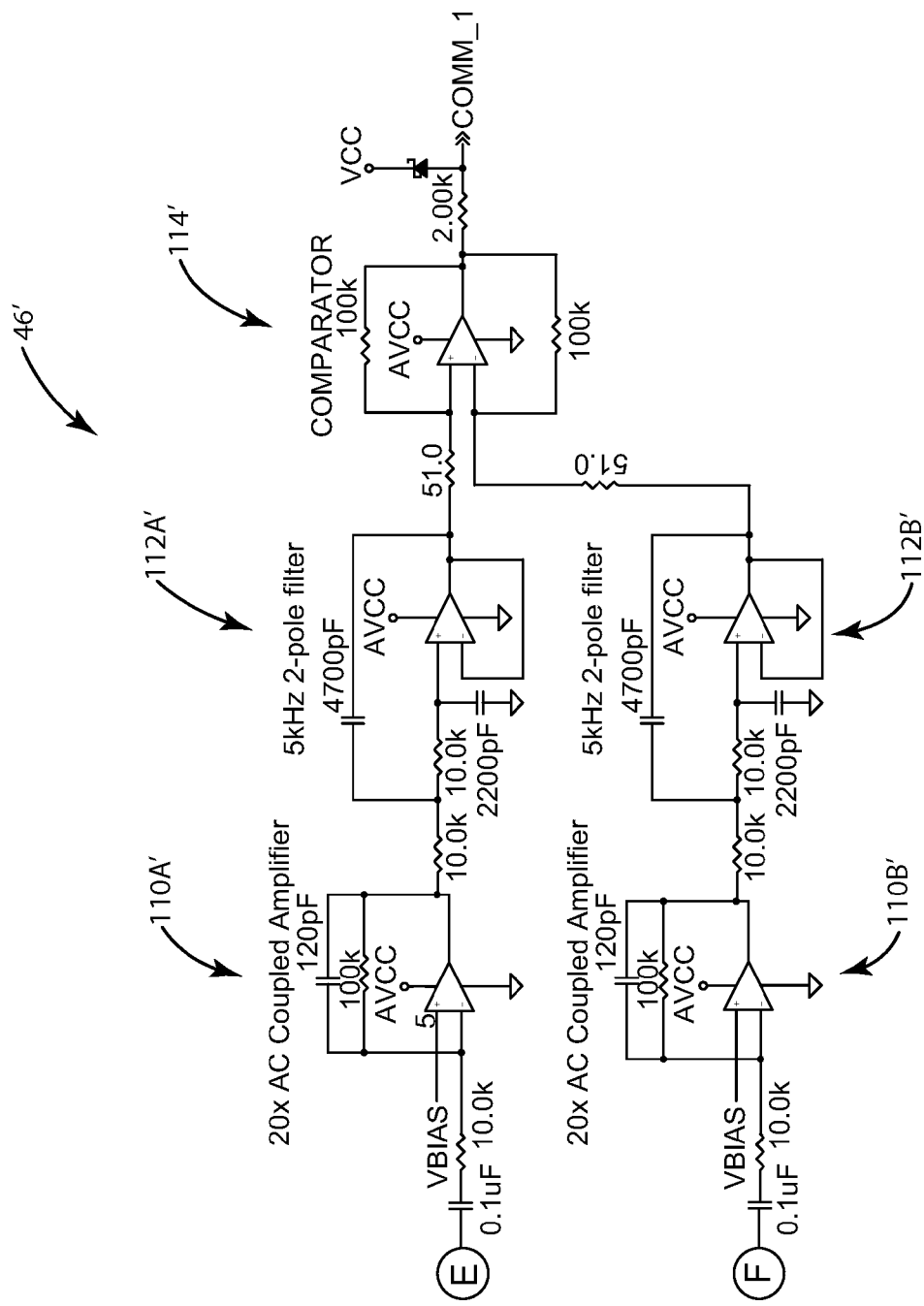

The communication signal produced by this second communications method may be received and decoded using a variety of alternative systems and methods. For purposes of disclosure, the present invention will be described in connection with communication receiver 22 of FIG. 2 and the demodulation circuitry of FIG. 13. As will be seen, the demodulation circuitry of FIG. 13 is similar to the demodulation circuitry of FIG. 11. It does not, however, include averaging circuitry 106a-106b.

In operation of this embodiment, the current sensor 45 produces a signal that is representative of the current in the tank circuit. The current sensor 45 may be a current sense transformer that produces a signal having a voltage that varies in proportion with the magnitude of the current in the tank circuit 40. As another alternative, the current sensor 45 may be an output taken from a divider having a scaling resistor and capacitor as shown in FIGS. 4-9. The current sensor 45 may be replaced by essentially any detector capable of producing a signal that is representative of a characteristic of power in the power supply 12 that is affected by the reflected impedance of the remote device 14.

In this embodiment, the detector circuit 46' includes a pair of amplifiers 102a'-102b' that produce a buffer copy and an inverted buffer copy of the signal output by the current sensor. As shown, in this embodiment, the current sensor signal may be passed to an amplifier and an inverting amplifier arranged in parallel with respect to one another. The output of the amplifier and the inverting amplifier may be passed to a pair of multiplexors 104a'-104b' that are coupled to a time slicing clock that is synchronized with the modulation clock in the remote device 14. The time slicing clock controls whether the buffer copy or the inverted copy of the current signal is passed to the remainder of the detector circuitry. In this embodiment, the clock signal is synchronized to the drive frequency multiplied by four. As shown, in this embodiment, the two multiplexors 104a'-104b' include opposite NO/NC inputs to provide a differential signal. As an alternative to flipping the NO/NC inputs, the clocking of one multiplexor with respect to another may be inverted to provide a differential signal. For example, multiplexor 104b' clocking may be inverted with respect to multiplexor 104a' clocking in order to provide a differential signal. In some cases, it may be desirable to clock the multiplexors 104a'-104b' with a signal that is a quadrature copy of the drive signal. The 90 degree phase shift may allow the circuitry to better capture the signal. Although the multiplexors of the illustrated embodiment have two inputs, the multiplexors 104a'-104b' could alternatively have a single input and the output may be left floating on the alternate clock phase. This could reduce the signal strength of the amplifier chain. In this embodiment, the clock signal may be derived from a variety of sources, such as the drive signal, the primary coil voltage, the primary coil current or a 90 degree shifted version of any of the foregoing.

Referring again to FIG. 13, multiplexor 104a' passes the buffer copy during the "A" time slices and passes the inverted copy during the "B" time slices, and multiplexor 104b' passes the buffer copy during the "B" time slices and passes the inverted copy during the "A" time slices.

In the detector circuit of FIG. 13, the output of each multiplexor 104a'-104b' is passed through a separate amplifier chain. In the illustrated embodiment, the output of each multiplexor 104a'-104b' is passed to a separate low pass filter 108a'-108b'. In this embodiment, the filters 108a'-108b' may be two pole 5 kHz low pass filters. These low pass filters 108a'-108b' function primarily to remove the AC components of the signal above the communication frequency range. Although this function is performed in the illustrated embodiment with op-amps, the op-amps may be replaced by alternative filtering circuitry, such as a passive filter or a digital filter.

In some applications, it may be desirable to amplify the outputs of the low pass filters 108a'-108b'. In the illustrated embodiment, the outputs of the low pass filters 108a'-108b' are passed to separate amplifiers 110a'-110b'. In the illustrated embodiment, the amplifiers 110a'-110b' are AC coupled amplifiers that amplify the filtered signal, maintaining a center point around Vbias. In this embodiment, the AC coupling removes any DC offset and serves as a single pole high pass filter.

The outputs of the amplifiers 110a'-110b' are passed to separate low pass filters 112a'-112b'. These low pass filters 112a'-112b' remove AC components of the signal above the communication frequency range and help to remove noise imparted by the AC amplifier 110a'-110b'. Although low pass filters 112a'-112b' are implemented in the illustrated embodiment with op-amps, the op-amps may be replaced by alternative filtering circuitry, such as a passive filter or a digital filter. In some applications, the signal-to-noise ratio of the outputs of the amplifiers may be sufficient so that low pass filters 112a'-112b' are unnecessary.

In the illustrated embodiment, the outputs of the final low pass filters 112a'-112b' are separately passed to a comparator 114'. The comparator 114' combines the differential signals from the two amplifier chains back into a single, "digitized" signal that can be readily decoded by a microcontroller, such as controller 36. As can be seen in FIG. 12I, the composite waveform combines to provide a negative DC offset when the encoded data is low, and to provide a positive DC offset when the encoded data is high. The output of the comparator 114' may be passed to the communication controller 36 for decoding. In this case, the communication controller 36 will decode the binary stream using the same scheme used to encode the data in the remote device 14, which in this illustration is a biphase encoding scheme.

As an alternative to the dual-chain circuitry of FIG. 13, the detector circuit 46' may alternatively incorporate a single ended detection chain. In such alternatives, the detector circuit may include only the topmost chain of FIG. 13, and the comparator 114' may have its negative input referenced to Vbias. The dual-chain circuitry of FIG. 13 may provide improved performance in some applications because the differential pair of amplifier chains provides improved signal-to-noise ratio as one signal is increasing in voltage while the other is decreasing. As a result, DC drift is unlikely to distort the signal.

In yet another alternative embodiment, the communications are encoded by modulating a communication load at one of two different frequencies. In one embodiment, the two different frequencies may be fixed frequencies. Having two different fixed frequencies for modulation may simplify the filter design for demodulation in the wireless power supply. In one embodiment, the two different frequencies may be fractions or multiples of the drive frequency, such as an integer fraction or an integer multiple. For example, in the illustrated embodiment, the communication resistor is modulated at one frequency to represent a logic high and at a different frequency to represent a logic low. In this embodiment, the communications controller 36 includes two different modulation clocks—one at $\frac{1}{8}^{th}$ the frequency of the carrier waveform and the other at $\frac{1}{10}^{th}$ the frequency of the carrier waveform. The frequency of the modulation clocks may vary from application to application. The modulation signal is a composite of the two modulation clocks created by combining the first modulation clock during a logic low and the second modulation clock during a logic high. The frequency shifting methodology of this embodiment will be described in more detail with references to FIGS. 14A-14H. FIG. 14A shows a sample data stream of 1s and 0s. FIG. 14B shows the sample data stream encoded using a biphase encoding scheme. The process for creating the modulated carrier waveform is described in more detail with reference to FIGS. 14C-14H, which show a short portion of the data stream containing a transition from a low signal to a high signal. FIG. 14C shows the carrier waveform, which as noted above is about 100 kHz for this illustration. FIG. 14D shows the modulation clock A signal. In this illustration, the frequency of modulation clock A is one eighth the frequency of the carrier. FIG. 14E shows the modulation clock B signal. In this illustration, the frequency of modulation clock B is one tenth the frequency of the carrier. The data stream is shown in FIG. 14F. The modulated carrier waveform is created by combining the carrier waveform (FIG. 14C) with either modulation clock A signal (FIG. 14D) or modulation clock B signal (FIG. 14E) using the encoded data signal (Fig. F) as a key. More specifically, during a low data signal, the carrier waveform is combined with the modulation clock A signal and, during a high data signal, the carrier waveform is combined with the modulation clock B signal. The resulting modulation clock waveform is shown in FIG. 14G. As can be seen, the modulation clock waveform modulates at one frequency while the encoded data is low, and switches to modulation at the other frequency when the encoded data is high. As can be seen, the waveform modulates more quickly for a logic low than for a logic high. In this illustration, each modulation includes four cycles of the carrier waveform during a logic low and five cycles of the carrier waveform during a logic high. The frequencies of the carrier waveform and the two modulation clock signals can be varied to alter the characteristics of the modulated carrier waveform.

Figure 15:
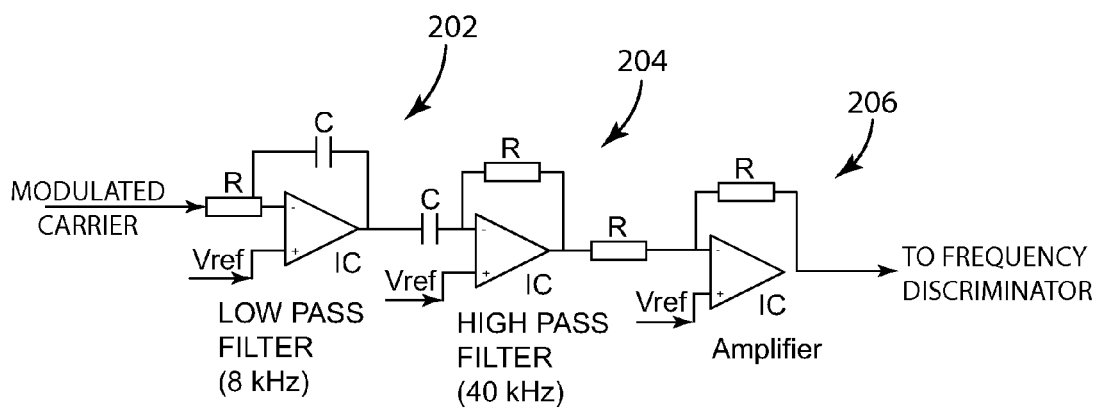
FIG. 15 is a simplified circuit diagram showing a portion of a third detector circuit.

The communication signal produced by this alternative communications method may be received and decoded using a variety of alternative systems and methods. For purposes of disclosure, the present invention will be described in connection with communication receiver 22 described above and in connection with FIG. 3 and FIG. 15. In operation of this embodiment, the current sensor 45 produces a signal that is representative of the current in the tank circuit. The current sensor 45 may be a current sense transformer that produces a signal having a voltage that varies with the magnitude of the current in the tank circuit 40. As another alternative, the current sensor 45 may be an output taken from a divider having a scaling resistor and capacitor as shown in FIGS. 4-9. The signal from the current sensor 45 may be passed through filtering and conditioning circuitry, such as a bandpass filter and an amplifier. The bandpass filter may include a low pass filter 202 and a high pass filter 204. The filters may be configured to filter out signals below the lowest frequency of operation divided by ten and above the highest frequency of operation divided by eight. The amplifier 206 may be configured to amplify the signal to an appropriate level for the frequency discriminator (not shown). The amplified output may be passed to the frequency discriminator (not shown). In one embodiment, the frequency discriminator is an integrated circuit system (ICS) that converts frequency to a voltage. The output of the ICS may be provided to controller 36 for decoding. In an alternative embodiment, the frequency discriminator may include a comparator (not shown) and a controller, such as controller 36. The comparator may produce a square wave output and the controller 36 may count the edges to determine the modulation frequency. In embodiments that incorporate a comparator, it may be desirable to incorporate a filter between the amplifier 206 and the comparator (not shown) depending in large part on the noise within the circuitry. The system may interpret a signal that alternates between high and low every four cycles to be a logic low, and the system may interpret a signal that alternates between high and low every five cycles to a logic high. In both of these embodiments, the communication controller 36 will decode the binary stream of logic highs and logic lows using a biphase decoding scheme.

Although the present invention is described in connection with a detector circuit 46 having analog circuitry for filtering and conditioning the signal before it is fed to the controller 36, the filtering, conditioning and/or comparator functions may alternatively be carried out using a digital signal processor (DSP). For example, in one alternative, the output of current sense transformer (or other detector) may be fed into a DSP (not shown). The DSP may convert the analog signal into a digital signal and then processes the digital signal to generate high and low outputs that are consistent with the high and low outputs that would have been generated using the circuitry described above. The DSP may process the input signal to remove signal components occurring outside the frequency range used for communications, analyze the remaining signal to identify the communication signals then provide an output signal that drives high and low with the communication signals.

In the illustrated embodiments, the communication receiver includes a detector circuit that demodulates communications through a current sense transformer that provides an output representative of the current in the tank circuit. The communication receiver may operate using alternative methods and apparatus. For example, the power supply may include a detector circuit that provides a signal indicative of the current in the input to the switching circuit (e.g. an amplifier coupled to the input of the switching circuit). As another example, the power supply may include a detector circuit that detects communications using the phase relationship of the voltage of the input to the switching circuit and the current in the tank circuit. As a further example, the power supply may include a detector circuit that detects communication using the voltage in the tank circuit. Operation of some of these alternative systems and methods for detecting communications is described in more detail in U.S. Provisional Application No. 61/298,021, entitled SYSTEMS AND METHODS FOR DETECTING DATA COMMUNICATION OVER A WIRELESS POWER LINK and filed on Jan. 25, 2010, which is incorporated herein by reference in its entirety.

The above description is that of current embodiments of the invention. Various alterations and changes can be made without departing from the spirit and broader aspects of the invention. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims.

The embodiments of the invention in which an exclusive property or privilege is claimed are defined as follows:

1. A method of communicating data between a remote device and an inductive power supply using keyed modulation, said method comprising:
   receiving inductive power via a variable frequency power transmission signal from the inductive power supply;
   encoding a data stream of bits into a fixed frequency communication signal;
   modulating the fixed frequency communication signal on the variable frequency power transmission signal by toggling a load of a communication transmitter, wherein each bit of the data stream is represented by a plurality of modulations on the variable frequency power transmission signal; and
   decoding the data stream from the variable frequency power transmission signal by timeslicing the variable frequency power transmission signal and comparing a DC offset between two time slices.

2. The method as claimed in claim 1 wherein the communication transmitter is configured to modulate the load, and wherein said modulating includes toggling the load in the communication transmitter at a rate that is a fraction of the variable frequency power transmission signal.

3. The method as claimed in claim 2 wherein the rate is one-half the variable frequency power transmission signal.

4. The method as claimed in claim 2 wherein said modulating includes toggling the load to increase a magnitude of every other waveform of the variable frequency power transmission signal.

5. The method as claimed in claim 4 wherein said modulating includes toggling the load on every even waveform or every odd waveform.

6. The method as claimed in claim 2 wherein said modulating includes toggling the load to increase the magnitude of the peak or the trough of every other waveform of the variable frequency power transmission signal.

7. The method as claimed in claim 1 wherein said modulating includes producing a modulator control signal formed by exclusive OR-ing (a) a modulation clock that is operating at an even integer fraction of the variable frequency power transmission signal and (b) the fixed frequency communication signal, wherein the variable frequency power transmission signal is modulated according to said modulator control signal.

8. The method as claimed in claim 1 wherein the communication transmitter is configured to modulate the load at a modulation rate that is phase locked at a harmonic of the variable frequency power transmission signal.

9. The method as claimed in claim 8 wherein the rate is four times the variable frequency power transmission signal.

10. The method as claimed in claim 8 wherein said modulating includes:
   producing a first modulation control signal formed by exclusive OR-ing (a) a modulation clock operating at the modulation rate and (b) the fixed frequency communication signal;
   producing a second modulation control signal formed by inverting the exclusive OR of (a) a modulation clock operating at the modulation rate and (b) the fixed frequency communication signal;
   toggling the modulation load according to the first modulation control signal during a positive half of the variable frequency power transmission signal; and
   toggling the modulation load according to the second modulation control signal during a negative half of the variable frequency power transmission signal.

11. The method as claimed in claim 8 further comprising decoding the data stream from the variable frequency power transmission signal by timeslicing the variable frequency power transmission signal and identifying DC offsets among the time slices.

12. The method as claimed in claim 1 wherein the load includes at least one of a resistive element, a capacitive element, and an inductive element.

13. The method as claimed in claim 1 wherein the communication transmitter modulates the fixed frequency communication signal on the variable frequency power transmission signal such that communication inversion is avoided.

14. A system for transferring power to a remote device from an inductive power supply and for communicating data from the remote device to the inductive power supply, said system comprising:
a power receiver adapted to receive a variable frequency power transmission signal;
a controller adapted to encode a data stream of bits into a fixed frequency communication signal;
a communication transmitter adapted to selectively toggle a load for modulating the fixed frequency communication signal on the variable frequency power transmission signal, wherein each bit of the data stream is represented by a plurality of modulations on the variable frequency power transmission signal; and
a detector configured to decode the data stream from the variable frequency power transmission signal by timeslicing the variable frequency power transmission signal and comparing a DC offset between two time slices.

15. The system as claimed in claim 14 wherein the communication transmitter is configured to modulate the load, and wherein said modulating includes toggling the load in the communication transmitter at a rate that is a fraction of the variable frequency power transmission signal.

16. The system as claimed in claim 15 wherein the rate is one-half the variable frequency power transmission signal.

17. The system as claimed in claim 15 wherein the load is toggled to increase a magnitude of every other waveform of the variable frequency power transmission signal.

18. The system as claimed in claim 17 wherein said modulating includes toggling the load on every even waveform or every odd waveform.

19. The system as claimed in claim 15 wherein the load is toggled to increase the magnitude of the peak or the trough of every other waveform of the variable frequency power transmission signal.

20. The system as claimed in claim 14 wherein the modulating includes producing a modulator control signal formed by exclusive OR-ing (a) a modulation clock that is operating at an even integer fraction of the variable frequency power transmission signal and (b) the fixed frequency communication signal, wherein the variable frequency power transmission signal is modulated according to said modulator control signal.

21. The system as claimed in claim 14 wherein the communication transmitter is configured to modulate the load at a modulation rate that is phase locked at a harmonic of the variable frequency power transmission signal.

22. The system as claimed in claim 21 wherein the rate is four times the variable frequency power transmission signal.

23. The system as claimed in claim 21 wherein the modulating includes:
producing a first modulation control signal formed by exclusive OR-ing (a) a modulation clock operating at the modulation rate and (b) the fixed frequency communication signal;
producing a second modulation control signal formed by inverting the exclusive OR of (a) a modulation clock operating at the modulation rate and (b) the fixed frequency communication signal;
toggling the modulation load according to the first modulation control signal during a positive half of the variable frequency power transmission signal; and
toggling the modulation load according to the second modulation control signal during a negative half of the variable frequency power transmission signal.

24. The system as claimed in claim 14 wherein the load includes at least one of a resistive element, a capacitive element, and an inductive element.

25. The system as claimed in claim 14 wherein the communication transmitter modulates the fixed frequency communication signal on the variable frequency power transmission signal such that communication inversion is avoided.

26. A system for transferring power to a remote device from an inductive power supply and for communicating data between the remote device and the inductive power supply using keyed modulation, said system comprising:
a power receiver adapted to receive a variable frequency power transmission signal;
a controller for encoding a data stream of bits in to a fixed frequency communication signal;
a communication transmitter selectively toggling a load for modulating the fixed frequency communication signal on the variable frequency power transmission signal, wherein each bit of the data stream is represented by a plurality of modulations on the variable frequency power transmission signal; and
an inductive power supply controller configured to decode the data stream from the variable frequency power transmission signal by timeslicing the variable frequency power transmission signal and comparing a DC offset between two time slices.

27. The system as claimed in claim 26 wherein said remote device includes said communication transmitter such that said remote device communicates data to the inductive power supply using keyed modulation, and wherein said inductive power supply includes detector circuitry for decoding the data stream from the variable frequency power transmission signal.

28. The system as claimed in claim 26 wherein said inductive power supply includes said communication transmitter such that said inductive power supply communicates data to the remote device using said keyed modulation, and wherein said remote device includes detector circuitry for decoding the data stream from the variable frequency power transmission signal.

29. The system as claimed in claim 26 wherein said communication transmitter is configured to modulate said load, and wherein the modulating includes toggling the load in the communication transmitter at a rate that is a fraction of the variable frequency power transmission signal.

30. The system as claimed in claim 29 wherein the rate is one-half the variable frequency power transmission signal.

31. The system as claimed in claim 29 wherein the load is toggled to increase a magnitude of every other waveform of the variable frequency power transmission signal.

32. The system as claimed in claim 30 wherein the load is toggled to increase the magnitude of the peak or the trough of every other waveform of the variable frequency power transmission signal.

33. The system as claimed in claim 32 wherein the modulating includes toggling the load on every even waveform or every odd waveform.

34. The system as claimed in claim 26 wherein the modulating includes producing a modulator control signal formed by exclusive OR-ing (a) a modulation clock that is operating at an even integer fraction of the variable frequency power transmission signal and (b) the fixed frequency communication signal, wherein the variable frequency power transmission signal is modulated according to said modulator control signal.

35. The system as claimed in claim 27 wherein the communication transmitter is configured to modulate the load at a modulation rate that is phase locked at a harmonic of the variable frequency power transmission signal.

36. The system as claimed in claim 35 wherein the rate is four times the variable frequency power transmission signal.

37. The system as claimed in claim 35 wherein said modulating includes:
   producing a first modulation control signal formed by exclusive OR-ing (a) a modulation clock operating at the modulation rate and (b) the fixed frequency communication signal;
   producing a second modulation control signal formed by inverting the exclusive OR of (a) a modulation clock operating at the modulation rate and (b) the fixed frequency communication signal;
   toggling the modulation load according to the first modulation control signal during a positive half of the variable frequency power transmission signal; and
   toggling the modulation load according to the second modulation control signal during a negative half of the variable frequency power transmission signal.

38. The system as claimed in claim 35 further comprising an inductive power supply controller configured to decode the data stream from the variable frequency power transmission signal by timeslicing the variable frequency power transmission signal and identifying DC offsets among the time slices.

39. The system as claimed in claim 26 wherein the load includes at least one of a resistive element, a capacitive element, and an inductive element.

40. The system as claimed in claim 26 wherein the communication transmitter modulates the fixed frequency communication signal on the variable frequency power transmission signal such that communication inversion is avoided.

41. An inductive power supply for transferring inductive power to a remote device and for receiving data via backscatter modulation from the remote device, said inductive power supply comprising:
   a power transmitter for transmitting a variable frequency power transmission signal;
   a wireless communication receiver configured to detect modulation on the variable frequency power transmission signal, wherein the inductive power supply decodes a data stream from the variable frequency power transmission signal, and wherein each bit of the data stream is represented by a plurality of modulations on the variable frequency power transmission signal; and
   wherein the inductive power supply decodes the data stream by timeslicing the variable frequency power transmission signal and comparing a DC offset between two time slices.

42. The inductive power supply as claimed in claim 41 wherein the fixed frequency communication signal is a bi-phase encoded representation of the data stream.

43. The inductive power supply of claim 41 wherein the inductive power supply includes a detector circuit having a first amplifier chain and a second amplifier chain;
   said first amplifier chain averaging (a) a buffered copy of even cycles of the variable frequency power transmission signal and (b) an inverted buffered copy of odd cycles of the variable frequency power transmission signal;
   said second amplifier chain averaging (a) a buffered copy of odd cycles of the variable frequency power transmission signal and (b) an inverted buffered copy of even cycles of the variable frequency power transmission signal; and
   wherein in response to comparing the output of the first amplifier chain and the second amplifier chain, the detector circuit outputs a fixed frequency communication signal representative of the data stream.

44. The inductive power supply of claim 41 wherein the inductive power supply includes a first detector circuit having a first amplifier chain that detects peaks of a buffered copy of even cycles of the variable frequency power transmission signal and a second amplifier chain that detects peaks of a buffered copy of odd cycles of the variable frequency power transmission signal, and
   wherein in response to comparing the output of the first amplifier chain and the second amplifier chain, the first detector circuit outputs a first level shift output.

45. The inductive power supply of claim 44 wherein the inductive power supply includes a second detector circuit having a first trough amplifier chain that detects troughs of a buffered inverted copy of even cycles of the variable frequency power transmission signal and a second trough amplifier chain that detects troughs of a buffered inverted copy of odd cycles of the variable frequency power transmission signal,
   wherein in response to comparing the output of the first trough amplifier chain and the second trough amplifier chain, the second detector circuit outputs a second level shift output, and
   wherein the first level shift output and the second level shift output are combined to form a fixed frequency communication signal representative of the data stream.

46. The inductive power supply as claimed in claim 41 wherein the inductive power supply decodes the data stream from the variable frequency power transmission signal by passing the variable frequency power transmission signal through a frequency discriminator.

* * * * *